United States Patent
Dastouri et al.

(10) Patent No.: US 12,474,647 B2
(45) Date of Patent: Nov. 18, 2025

(54) GENERATING AN ALIGNMENT SIGNAL BASED ON LOCAL ALIGNMENT MARK DISTORTIONS

(71) Applicants: ASML HOLDING N.V., Veldhoven (NL); ASML NETHERLANDS B.V., Veldhoven (NL)

(72) Inventors: Zahrasadat Dastouri, Norwalk, CT (US); Igor Matheus Petronella Aarts, Port Chester, NY (US); Simon Gijsbert Josephus Mathijssen, Rosmalen (NL); Peter David Engblom, Hillsboro, OR (US)

(73) Assignees: ASML NETHERLANDS B.V., Veldhoven (NL); ASML HOLDING N.V., Veldhoven (NL)

( * ) Notice: Subject to any disclaimer, the term of this patent is extended or adjusted under 35 U.S.C. 154(b) by 0 days.

(21) Appl. No.: 17/922,922

(22) PCT Filed: Apr. 22, 2021

(86) PCT No.: PCT/EP2021/060595
§ 371 (c)(1),
(2) Date: Nov. 2, 2022

(87) PCT Pub. No.: WO2021/233642
PCT Pub. Date: Nov. 25, 2021

(65) Prior Publication Data
US 2023/0176494 A1  Jun. 8, 2023

Related U.S. Application Data

(60) Provisional application No. 63/026,893, filed on May 19, 2020.

(51) Int. Cl.
*G03F 9/00* (2006.01)
*G03F 7/00* (2006.01)

(52) U.S. Cl.
CPC ........ *G03F 9/7088* (2013.01); *G03F 7/70633* (2013.01); *G03F 9/7049* (2013.01); *G03F 9/7092* (2013.01)

(58) Field of Classification Search
CPC .. G03F 7/70633; G03F 9/7049; G03F 9/7088; G03F 9/7092
See application file for complete search history.

(56) References Cited

U.S. PATENT DOCUMENTS

| 6,034,378 | A | 3/2000 | Shiraishi |
| 6,046,792 | A | 4/2000 | Van der Werf et al. |

(Continued)

FOREIGN PATENT DOCUMENTS

| CN | 103858208 | 6/2014 |
| JP | S60042763 | 3/1985 |

(Continued)

OTHER PUBLICATIONS

International Search Report and Written Opinion issued in corresponding PCT Patent Application No. PCT/EP2021/060595, dated Aug. 4, 2021.

(Continued)

*Primary Examiner* — Peter B Kim
(74) *Attorney, Agent, or Firm* — Pillsbury Winthrop Shaw Pittman, LLP

(57) ABSTRACT

A method for generating an alignment signal that includes detecting local dimensional distortions of an alignment mark and generating the alignment signal based on the alignment mark. The alignment signal is weighted based on the local dimensional distortions of the alignment mark. Detecting the local dimensional distortions can include irradiating the alignment mark with radiation, the alignment mark including a geometric feature, and detecting one or more phase and/or amplitude shifts in reflected radiation from the geo- (Continued)

metric feature. The one or more phase and/or amplitude shifts correspond to the local dimensional distortions of the geometric feature. A parameter of the radiation, an alignment inspection location within the geometric feature, an alignment inspection location on a layer of a structure, and/or a radiation beam trajectory across the geometric feature may be determined based on the one or more detected phase and/or amplitude shifts.

20 Claims, 12 Drawing Sheets

(56) References Cited

U.S. PATENT DOCUMENTS

| | | | |
|---|---|---|---|
| 6,961,116 | B2 | 11/2005 | Den Boef et al. |
| 8,518,614 | B2 | 8/2013 | Egashira |
| 10,527,949 | B2 | 1/2020 | Dan Boef et al. |
| 2006/0066855 | A1 | 3/2006 | Boef et al. |
| 2013/0141723 | A1 | 6/2013 | Wei et al. |
| 2015/0011026 | A1 | 1/2015 | Oishi |
| 2015/0227061 | A1 | 8/2015 | Tinnemans et al. |
| 2018/0196363 | A1* | 7/2018 | Bijnen ................ G03F 7/70258 |
| 2020/0018709 | A1* | 1/2020 | Hosler .............. H01L 21/67259 |
| 2022/0276575 | A1* | 9/2022 | Hulsebos ............ G03F 7/70641 |

FOREIGN PATENT DOCUMENTS

| | | |
|---|---|---|
| JP | H08213300 | 8/1996 |
| JP | H09292596 | 11/1997 |
| JP | H1022207 | 1/1998 |
| JP | 2013118369 | 6/2013 |
| JP | 2015015318 | 1/2015 |
| JP | 2017537352 | 12/2017 |
| JP | 2020038384 | 3/2020 |
| WO | 2019141481 | 7/2019 |

OTHER PUBLICATIONS

Office Action issued in corresponding Japanese Patent Application No. 2022-566625, dated Dec. 26, 2023.
Office Action issued in corresponding Chinese Patent Application No. 202180036391.0, dated Jun. 22, 2025.

* cited by examiner

GENERATING AN ALIGNMENT SIGNAL BASED ON LOCAL ALIGNMENT MARK DISTORTIONS

CROSS-REFERENCE TO RELATED APPLICATIONS

This application is the U.S. national phase entry of PCT Patent Application No. PCT/EP2021/060595 which was filed on Apr. 22, 2021, which claims priority of U.S. Provisional Patent Application No. 63/026,893, which was filed on May 19, 2020, and which is incorporated herein in its entirety by reference.

TECHNICAL FIELD

The description herein relates generally to generating an alignment signal based on local alignment mark distortions.

BACKGROUND

A lithographic projection apparatus can be used, for example, in the manufacture of integrated circuits (ICs). A patterning device (e.g., a mask) may include or provide a pattern corresponding to an individual layer of the IC ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate includes a plurality of adjacent target portions to which the pattern is transferred successively by the lithographic projection apparatus, one target portion at a time. In one type of lithographic projection apparatuses, the pattern on the entire patterning device is transferred onto one target portion in one operation. Such an apparatus is commonly referred to as a stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic projection apparatus will have a reduction ratio M (e.g., 4), the speed F at which the substrate is moved will be 1/M times that at which the projection beam scans the patterning device. More information with regard to lithographic devices as described herein can be gleaned, for example, from U.S. Pat. No. 6,046,792, incorporated herein by reference.

Prior to transferring the pattern from the patterning device to the substrate, the substrate may undergo various procedures, such as priming, resist coating, and a soft bake. After exposure, the substrate may be subjected to other procedures ("post-exposure procedures"), such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, deposition, chemo-mechanical polishing, etc., all intended to finish the individual layer of the device. If several layers are required in the device, then the whole procedure, or a variant thereof, is repeated for each layer. Eventually, a device will be present in each target portion on the substrate. These devices are then separated from one another by a technique such as dicing or sawing, such that the individual devices can be mounted on a carrier, connected to pins, etc.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, deposition, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, deposition, etc.

As noted, lithography is a central step in the manufacturing of device such as ICs, where patterns formed on substrates define functional elements of the devices, such as microprocessors, memory chips, etc. Similar lithographic techniques are also used in the formation of flat panel displays, micro-electro mechanical systems (MEMS) and other devices.

As semiconductor manufacturing processes continue to advance, the dimensions of functional elements have continually been reduced while the number of functional elements, such as transistors, per device has been steadily increasing over decades, following a trend commonly referred to as "Moore's law". At the current state of technology, layers of devices are manufactured using lithographic projection apparatuses that project a design layout onto a substrate using illumination from a deep-ultraviolet illumination source, creating individual functional elements having dimensions well below 100 nm, i.e. less than half the wavelength of the radiation from the illumination source (e.g., a 193 nm illumination source).

This process in which features with dimensions smaller than the classical resolution limit of a lithographic projection apparatus are printed, is commonly known as low-$k_1$ lithography, according to the resolution formula $CD=k_1\times\lambda/NA$, where $\lambda$ is the wavelength of radiation employed (currently in most cases 248 nm or 193 nm), NA is the numerical aperture of projection optics in the lithographic projection apparatus, CD is the "critical dimension"—generally the smallest feature size printed—and $k_1$ is an empirical resolution factor. In general, the smaller $k_1$ the more difficult it becomes to reproduce a pattern on the substrate that resembles the shape and dimensions planned by a designer in order to achieve particular electrical functionality and performance. To overcome these difficulties, sophisticated fine-tuning steps are applied to the lithographic projection apparatus, the design layout, or the patterning device. These include, for example, but are not limited to, optimization of NA and optical coherence settings, customized illumination schemes, use of phase shifting patterning devices, optical proximity correction (OPC, sometimes also referred to as "optical and process correction") in the design layout, or other methods generally defined as "resolution enhancement techniques" (RET).

SUMMARY

According to an embodiment, a method for generating an alignment signal is provided. The method comprises detecting one or more local dimensional distortions of an alignment mark, and generating the alignment signal based on the alignment mark. The alignment signal is weighted based on the one or more local dimensional distortions of the alignment mark.

In an embodiment, detecting the one or more local dimensional distortions comprises: irradiating the alignment mark with radiation. The alignment mark comprises a geometric feature. Detecting the one or more local dimensional distortions also comprises detecting one or more phase and/or amplitude shifts in reflected radiation from the geometric feature. The one or more phase and/or amplitude shifts correspond to one or more local dimensional distortions of the geometric feature.

In an embodiment, the method further comprises determining, based on the one or more detected phase and/or amplitude shifts, one or more of a parameter of the radiation, an alignment inspection location within the geometric feature, an alignment inspection location on a layer of a structure, or a radiation beam trajectory across the geometric feature.

In an embodiment, the geometric feature comprises a grating.

In an embodiment, detecting the one or more phase and/or amplitude shifts in the reflected radiation from the geometric feature comprises measuring a phase difference in reflected radiation of different diffraction orders.

In an embodiment, generating the alignment signal comprises: determining, based on the one or more detected phase and/or amplitude shifts, one or more areas of the geometric feature that are relatively more symmetrical than other areas of the geometric feature; and weighting one or more portions of a reflected radiation signal that correspond to radiation reflected from the one or more relatively more symmetrical areas heavier than other portions of the reflected radiation signal.

In an embodiment, the alignment mark is included in a layer of a substrate in a semiconductor device structure.

In an embodiment, the method further comprises adjusting a semiconductor device manufacturing parameter based on the alignment signal.

According to another embodiment, a non-transitory computer readable medium having instructions thereon is provided. The instructions when executed by a computer cause the computer to: detect one or more local dimensional distortions of an alignment mark; and generate an alignment signal based on the alignment mark. The alignment signal is weighted based on the one or more local dimensional distortions of the alignment mark.

In an embodiment, detecting the one or more local dimensional distortions comprises: controlling irradiation of the alignment mark with radiation, the alignment mark comprising a geometric feature; and detecting one or more phase and/or amplitude shifts in reflected radiation from the geometric feature, the one or more phase and/or amplitude shifts corresponding to one or more local dimensional distortions of the geometric feature.

In an embodiment, the instructions further cause the computer to determine, based on the one or more detected phase and/or amplitude shifts, one or more of a parameter of the radiation, an alignment inspection location within the geometric feature, an alignment inspection location on a layer of a structure, or a radiation beam trajectory across the geometric feature.

In an embodiment, the geometric feature comprises a grating.

In an embodiment, detecting the one or more phase and/or amplitude shifts in the reflected radiation from the geometric feature comprises measuring a phase difference in reflected radiation of different diffraction orders.

In an embodiment, generating the alignment signal comprises: determining, based on the one or more detected phase and/or amplitude shifts, one or more areas of the geometric feature that are relatively more symmetrical than other areas of the geometric feature; and weighting one or more portions of a reflected radiation signal that correspond to radiation reflected from the one or more relatively more symmetrical areas heavier than other portions of the reflected radiation signal.

In an embodiment, the alignment mark is included in a layer of a substrate in a semiconductor device structure, the instructions further causing the computer to adjust a semiconductor device manufacturing parameter based on the alignment signal.

According to another embodiment, a system configured to generate an alignment signal is provided. The system comprises: one or more sensors configured to detect one or more local dimensional distortions of an alignment mark; and one or more processors configured to generate the alignment signal based on the alignment mark. The alignment signal is weighted based on the one or more local dimensional distortions of the alignment mark.

In an embodiment, the system further comprises a radiation source configured to irradiate the alignment mark with radiation, and detecting the one or more local dimensional distortions comprises: irradiating, with the radiation source, the alignment mark with radiation, the alignment mark comprising a geometric feature; and detecting, with the one or more sensors, one or more phase and/or amplitude shifts in reflected radiation from the geometric feature, the one or more phase and/or amplitude shifts corresponding to one or more local dimensional distortions of the geometric feature.

In an embodiment, the one or more processors are further configured to determine, based on the one or more detected phase and/or amplitude shifts, one or more of a parameter of the radiation, an alignment inspection location within the geometric feature, an alignment inspection location on a layer of a structure, or a radiation beam trajectory across the geometric feature.

In an embodiment, the geometric feature comprises a grating.

In an embodiment, detecting the one or more phase and/or amplitude shifts in the reflected radiation from the geometric feature comprises measuring a phase difference in reflected radiation of different diffraction orders.

In an embodiment, generating the alignment signal comprises: determining, based on the one or more detected phase and/or amplitude shifts, one or more areas of the geometric feature that are relatively more symmetrical than other areas of the geometric feature; and weighting one or more portions of a reflected radiation signal that correspond to radiation reflected from the one or more relatively more symmetrical areas heavier than other portions of the reflected radiation signal. In an embodiment, the alignment mark is included in a layer of a substrate in a semiconductor device structure.

In an embodiment, the one or more processors are further configured to adjust a semiconductor device manufacturing parameter based on the alignment signal.

In an embodiment, a method for adjusting a semiconductor device manufacturing parameter is provided. The method comprises: detecting one or more local dimensional distortions of an alignment mark; and generating an alignment signal based on the alignment mark, the alignment signal being weighted based on the one or more local dimensional distortions of the alignment mark, the alignment signal configured to be used to adjust the semiconductor device manufacturing parameter.

In an embodiment, the method further comprises adjusting the semiconductor device manufacturing parameter based on the alignment signal.

In an embodiment, the semiconductor device manufacturing parameter is a stage position.

In an embodiment, detecting the one or more local dimensional distortions comprises: irradiating the alignment mark with radiation, the alignment mark comprising a geometric feature; and detecting one or more phase and/or amplitude shifts in reflected radiation from the geometric feature, the one or more phase and/or amplitude shifts corresponding to one or more local dimensional distortions of the geometric feature.

In an embodiment, the method further comprises determining, based on the one or more detected phase and/or amplitude shifts, one or more of a parameter of the radiation, an alignment inspection location within the geometric feature, an alignment inspection location on a layer of a semiconductor device structure, or a radiation beam trajectory across the geometric feature.

BRIEF DESCRIPTION OF THE DRAWINGS

The above aspects and other aspects and features will become apparent to those ordinarily skilled in the art upon review of the following description of specific embodiments in conjunction with the accompanying figures.

DETAILED DESCRIPTION

Figure 1:
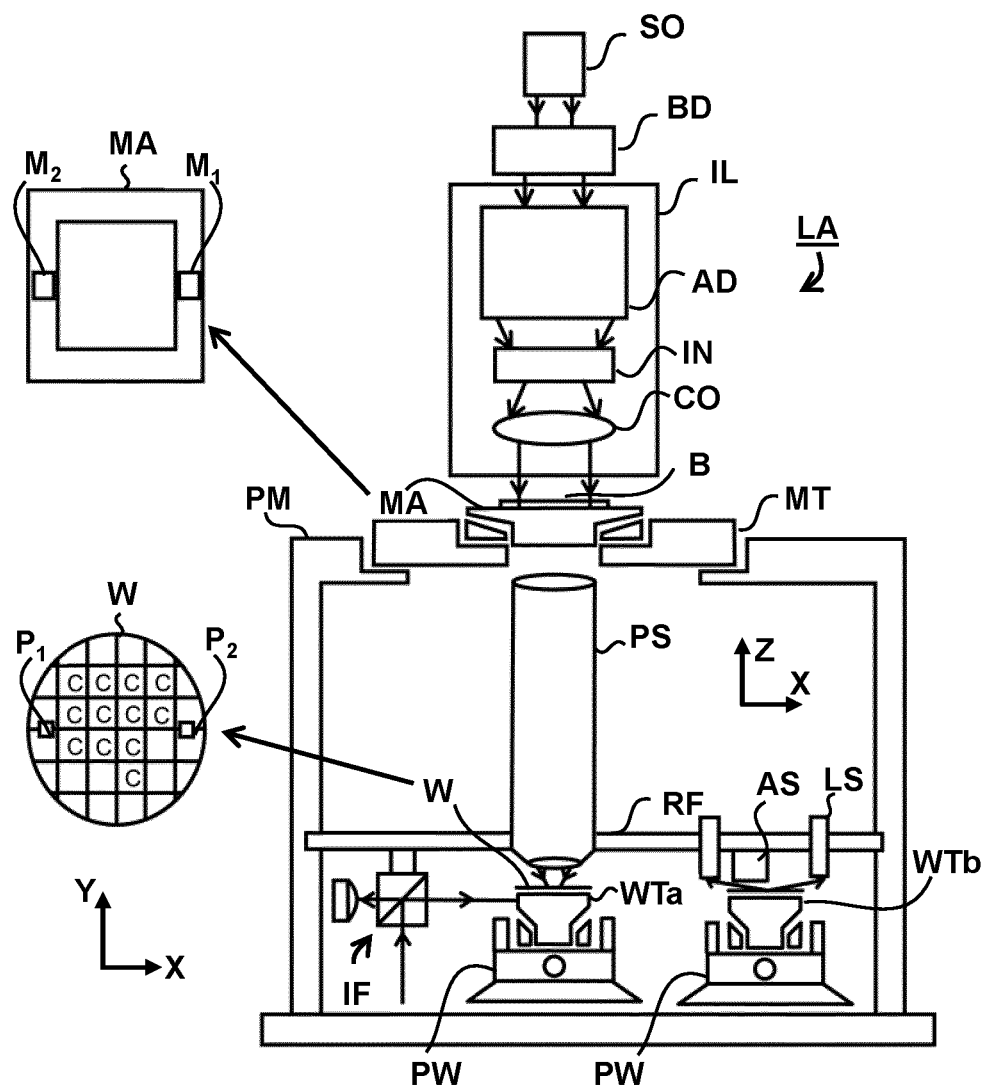
FIG. 1 schematically depicts a lithography apparatus, according to an embodiment.

In semiconductor device manufacturing, determining alignment includes determining the position of an alignment mark (or marks) in a layer of a semiconductor device structure. Alignment is determined by irradiating an alignment mark with radiation, and comparing characteristics of different diffraction orders of radiation reflected from the alignment mark. Alignment is typically determined for an alignment mark as a whole. The determined alignment is often an average or something similar, determined based on information conveyed by radiation reflected from the whole alignment mark. For example, alignment may be determined based on a Fourier fit of an alignment signal as a function of stage position (e.g., for a stage holding the semiconductor device structure).

However, alignment marks often have local (intra-mark) dimensional distortions (e.g., dimensions that deviate from an intended design), that create local alignment mark asymmetries. For example, an angle of a sidewall that forms part of the alignment mark may be unintentionally tilted in a given area, and/or other local dimensional distortions may occur. The local alignment mark dimensional distortions and/or asymmetries are not accounted for during typical alignment determination. This may limit the accuracy of a typical alignment determination.

Advantageously, the present system(s) and method(s) reduce the impact of local alignment mark dimensional deformations on an alignment determination, and thereby enhance the accuracy of the alignment determination. The present system(s) and method(s) are configured to detect local dimensional distortions of an alignment mark and weight an alignment signal based on the local dimensional distortions. The local dimensional distortions are detected based on phase and/or amplitude shifts in radiation reflected from an alignment mark. The weighting is configured such that more symmetrical areas of an alignment mark are more influential (e.g., weighted heavier) on the alignment determination compared to less symmetrical areas of the alignment mark.

For example, using the present system(s) and method(s), an alignment mark is irradiated. One or more phase and/or amplitude shifts in reflected radiation from the alignment mark are detected. The phase and/or amplitude shifts correspond to local dimensional distortions of the alignment mark. Based on the phase and/or amplitude shifts, portions of a reflected radiation signal that correspond to radiation reflected from relatively more symmetrical areas (e.g., areas with little to no local dimensional distortions as indicated by a lack of phase and/or amplitude shifts) of the alignment mark are weighted heavier than other portions of the reflected radiation signal. Alignment is determined based on the weighted signal such that lightly weighted portions of the signal that correspond to dimensionally distorted/less symmetrical areas of the alignment mark have little to no influence on the alignment determination.

By way of a brief introduction, the description herein relates generally to semiconductor device manufacturing and patterning processes. More particularly, the following paragraphs describe several components of a system and/or related systems, as well as methods for determining relative positions of alignment marks in layers of a structure. As described above these systems and methods may be used for measuring alignment in a semiconductor device manufacturing process, for example, or during other operations.

Although specific reference may be made in this text to the manufacture of integrated circuits (ICs) for semiconductor devices, it should be understood that the description herein has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as interchangeable with the more general terms "mask", "substrate" and "target portion", respectively.

The term "projection optics" as used herein should be broadly interpreted as encompassing various types of optical systems, including refractive optics, reflective optics, apertures and catadioptric optics, for example. The term "projection optics" may also include components operating according to any of these design types for directing, shaping or controlling the projection beam of radiation, collectively or singularly. The term "projection optics" may include any optical component in the lithographic projection apparatus, no matter where the optical component is located on an optical path of the lithographic projection apparatus. Projection optics may include optical components for shaping, adjusting and/or projecting radiation from the source before the radiation passes the patterning device, and/or optical components for shaping, adjusting and/or projecting the radiation after the radiation passes the patterning device. The projection optics generally exclude the source and the patterning device.

FIG. 1 schematically depicts an embodiment of a lithographic apparatus LA. The apparatus comprises an illumination system (illuminator) IL configured to condition a radiation beam B (e.g. UV radiation, DUV radiation, or EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT (e.g., WTa, WTb or both) configured to hold a substrate (e.g. a resist-coated wafer) W and coupled to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies and often referred to as fields) of the substrate W. The projection system is supported on a reference frame RF.

As depicted, the apparatus is of a transmissive type (e.g. employing a transmissive mask). Alternatively, the apparatus may be of a reflective type (e.g. employing a programmable mirror array of a type as referred to above, or employing a reflective mask).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases, the source may be an integral part of the apparatus, for example when the source is a mercury lamp. The source SO and the illuminator IL, together with the beam delivery system BD if required, may be referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

The illuminator IL may comprise adjuster AD configured to adjust the (angular/spatial) intensity distribution of the beam. Generally, at least the outer and/or inner radial extent (commonly referred to as σ-outer and σ-inner, respectively) of the intensity distribution in a pupil plane of the illuminator can be adjusted. The illuminator IL may be operable to vary the angular distribution of the beam. For example, the illuminator may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution. A desired illumination mode may be obtained, e.g., by inserting an optic which provides that illumination mode into the illuminator IL or using a spatial light modulator.

The illuminator IL may be operable to alter the polarization of the beam and may be operable to adjust the polarization using adjuster AD. The polarization state of the radiation beam across a pupil plane of the illuminator IL may be referred to as a polarization mode. The use of different polarization modes may allow greater contrast to be achieved in the image formed on the substrate W. The radiation beam may be unpolarized. Alternatively, the illuminator may be arranged to linearly polarize the radiation beam. The polarization direction of the radiation beam may vary across a pupil plane of the illuminator IL. The polarization direction of radiation may be different in different regions in the pupil plane of the illuminator IL. The polarization state of the radiation may be chosen in dependence on the illumination mode. For multi-pole illumination modes, the polarization of each pole of the radiation beam may be generally perpendicular to the position vector of that pole in the pupil plane of the illuminator IL. For example, for a dipole illumination mode, the radiation may be linearly polarized in a direction that is substantially perpendicular to a line that bisects the two opposing sectors of the dipole. The radiation beam may be polarized in one of two different orthogonal directions, which may be referred to as X-polarized and Y-polarized states. For a quadrupole illumination mode, the radiation in the sector of each pole may be linearly polarized in a direction that is substantially perpendicular to a line that bisects that sector. This polarization mode may be referred to as XY polarization. Similarly, for a hexapole illumination mode the radiation in the sector of each pole may be linearly polarized in a direction that is substantially perpendicular to a line that bisects that sector. This polarization mode may be referred to as TE polarization.

In addition, the illuminator IL generally comprises various other components, such as an integrator IN and a condenser CO. The illumination system may include various types of optical components, such as refractive, reflective, magnetic, electromagnetic, electrostatic or other types of optical components, or any combination thereof, for directing, shaping, or controlling radiation.

Thus, the illuminator provides a conditioned beam of radiation B, having a desired uniformity and intensity distribution in its cross section.

The support structure MT supports the patterning device in a manner that depends on the orientation of the patterning device, the design of the lithographic apparatus, and other conditions, such as for example whether or not the patterning device is held in a vacuum environment. The support structure may use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a pattern in a target portion of the substrate. In an embodiment, a patterning device is any device that can be used to impart a radiation beam with a pattern in its cross-section to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in a target portion of the device, such as an integrated circuit.

A patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The projection system PS has an optical transfer function which may be non-uniform, which can affect the pattern imaged on the substrate W. For unpolarized radiation such effects can be fairly well described by two scalar maps, which describe the transmission (apodization) and relative phase (aberration) of radiation exiting the projection system PS as a function of position in a pupil plane thereof. These scalar maps, which may be referred to as the transmission map and the relative phase map, may be expressed as a linear combination of a complete set of basis functions. A convenient set is the Zernike polynomials, which form a set of orthogonal polynomials defined on a unit circle. A determination of each scalar map may involve determining the coefficients in such an expansion. Since the Zernike polynomials are orthogonal on the unit circle, the Zernike coefficients may be determined by calculating the inner product of a measured scalar map with each Zernike polynomial in turn and dividing this by the square of the norm of that Zernike polynomial.

The transmission map and the relative phase map are field and system dependent. That is, in general, each projection system PS will have a different Zernike expansion for each field point (i.e. for each spatial location in its image plane). The relative phase of the projection system PS in its pupil plane may be determined by projecting radiation, for example from a point-like source in an object plane of the projection system PS (i.e. the plane of the patterning device MA), through the projection system PS and using a shearing interferometer to measure a wavefront (i.e. a locus of points with the same phase). A shearing interferometer is a common path interferometer and therefore, advantageously, no secondary reference beam is required to measure the wavefront. The shearing interferometer may comprise a geometric feature such as a diffraction grating, for example a two dimensional grid, in an image plane of the projection system (i.e. the substrate table WT) and a detector arranged to detect an interference pattern in a plane that is conjugate to a pupil plane of the projection system PS. The interference pattern is related to the derivative of the phase of the radiation with respect to a coordinate in the pupil plane in the shearing direction. The detector may comprise an array of sensing elements such as, for example, charge coupled devices (CCDs).

The projection system PS of a lithography apparatus may not produce visible fringes and therefore the accuracy of the determination of the wavefront can be enhanced using phase stepping techniques such as, for example, moving the diffraction grating. Stepping may be performed in the plane of the diffraction grating and in a direction perpendicular to the scanning direction of the measurement. The stepping range may be one grating period, and at least three (uniformly distributed) phase steps may be used. Thus, for example, three scanning measurements may be performed in the y-direction, each scanning measurement being performed for a different position in the x-direction. This stepping of the diffraction grating effectively transforms phase variations into intensity variations, allowing phase information to be determined. The grating may be stepped in a direction perpendicular to the diffraction grating (z direction) to calibrate the detector.

The diffraction grating may be sequentially scanned in two perpendicular directions, which may coincide with axes of a co-ordinate system of the projection system PS (x and y) or may be at an angle such as 45 degrees to these axes. Scanning may be performed over an integer number of grating periods, for example one grating period. The scanning averages out phase variation in one direction, allowing phase variation in the other direction to be reconstructed. This allows the wavefront to be determined as a function of both directions.

The transmission (apodization) of the projection system PS in its pupil plane may be determined by projecting radiation, for example from a point-like source in an object plane of the projection system PS (i.e. the plane of the patterning device MA), through the projection system PS and measuring the intensity of radiation in a plane that is conjugate to a pupil plane of the projection system PS, using a detector. The same detector as is used to measure the wavefront to determine aberrations may be used.

The projection system PS may comprise a plurality of optical (e.g., lens) elements and may further comprise an adjustment mechanism configured to adjust one or more of the optical elements to correct for aberrations (phase variations across the pupil plane throughout the field). To achieve this, the adjustment mechanism may be operable to manipulate one or more optical (e.g., lens) elements within the projection system PS in one or more different ways. The projection system may have a co-ordinate system wherein its optical axis extends in the z direction. The adjustment mechanism may be operable to do any combination of the following: displace one or more optical elements; tilt one or more optical elements; and/or deform one or more optical elements. Displacement of an optical element may be in any direction (x, y, z or a combination thereof). Tilting of an optical element is typically out of a plane perpendicular to the optical axis, by rotating about an axis in the x and/or y directions although a rotation about the z axis may be used for a non-rotationally symmetric aspherical optical element. Deformation of an optical element may include a low frequency shape (e.g. astigmatic) and/or a high frequency shape (e.g. free form aspheres). Deformation of an optical element may be performed for example by using one or more actuators to exert force on one or more sides of the optical element and/or by using one or more heating elements to heat one or more selected regions of the optical element. In general, it may not be possible to adjust the projection system PS to correct for apodization (transmission variation across the pupil plane). The transmission map of a projection system PS may be used when designing a patterning device (e.g., mask) MA for the lithography apparatus LA. Using a computational lithography technique, the patterning device MA may be designed to at least partially correct for apodization.

The lithographic apparatus may be of a type having two (dual stage) or more tables (e.g., two or more substrate tables WTa, WTb, two or more patterning device tables, a substrate table WTa and a table WTb below the projection system without a substrate that is dedicated to, for example, facilitating measurement, and/or cleaning, etc.). In such "multiple stage" machines, the additional tables may be used in parallel, or preparatory steps may be carried out on one or more tables while one or more other tables are being used for exposure. For example, alignment measurements using an alignment sensor AS and/or level (height, tilt, etc.) measurements using a level sensor LS may be made.

The lithographic apparatus may also be of a type wherein at least a portion of the substrate may be covered by a liquid having a relatively high refractive index, e.g. water, to fill a space between the projection system and the substrate. An immersion liquid may also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

In operation of the lithographic apparatus, a radiation beam is conditioned and provided by the illumination system IL. The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus may be used in at least one of the following modes. In step mode, the support structure MT and the substrate table WT are kept essentially stationary, while a pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed, and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above-described modes of use or entirely different modes of use may also be employed.

The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already includes multiple processed layers.

The terms "radiation" and "beam" used herein with respect to lithography encompass all types of electromagnetic radiation, including ultraviolet (UV) or deep ultraviolet (DUV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

Various patterns on or provided by a patterning device may have different process windows. i.e., a space of processing variables under which a pattern will be produced within specification. Examples of pattern specifications that relate to potential systematic defects include checks for necking, line pull back, line thinning, CD, edge placement, overlapping, resist top loss, resist undercut and/or bridging. The process window of the patterns on a patterning device or an area thereof may be obtained by merging (e.g., overlapping) process windows of each individual pattern. The boundary of the process window of a group of patterns comprises boundaries of process windows of some of the individual patterns. In other words, these individual patterns limit the process window of the group of patterns. These patterns can be referred to as "hot spots" or "process window limiting patterns (PWLPs)," which are used interchangeably herein. When controlling a part of a patterning process, it is possible and economical to focus on the hot spots. When the hot spots are not defective, it is most likely that other patterns are not defective.

Figure 2:
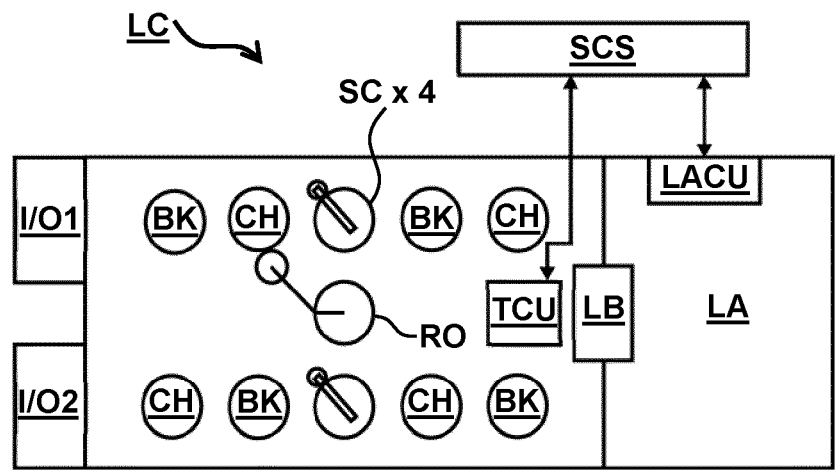
FIG. 2 schematically depicts an embodiment of a lithographic cell or cluster, according to an embodiment.

As shown in FIG. 2, the lithographic apparatus LA may form part of a lithographic cell LC, also sometimes referred to a lithocell or cluster, which also includes apparatuses to perform pre- and post-exposure processes on a substrate. Conventionally these include one or more spin coaters SC to deposit one or more resist layers, one or more developers to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency.

In order that a substrate that is exposed by the lithographic apparatus is exposed correctly and consistently and/or in order to monitor a part of the patterning process (e.g., a device manufacturing process) that includes at least one pattern transfer step (e.g., an optical lithography step), it is desirable to inspect a substrate or other object to measure or determine one or more properties such as alignment, overlay (which can be, for example, between structures in overlying layers or between structures in a same layer that have been provided separately to the layer by, for example, a double patterning process), line thickness, critical dimension (CD), focus offset, a material property, etc. Accordingly, a manufacturing facility in which lithocell LC is located also typically includes a metrology system that measures some or all of the substrates W (FIG. 1) that have been processed in the lithocell or other objects in the lithocell. The metrology system may be part of the lithocell LC, for example it may be part of the lithographic apparatus LA (such as alignment sensor AS (FIG. 1)).

The one or more measured parameters may include, for example, alignment, overlay between successive layers formed in or on the patterned substrate, critical dimension (CD) (e.g., critical linewidth) of, for example, features formed in or on the patterned substrate, focus or focus error of an optical lithography step, dose or dose error of an optical lithography step, optical aberrations of an optical lithography step, etc. This measurement may be performed on a target of the product substrate itself and/or on a dedicated metrology target provided on the substrate. The measurement can be performed after-development of a resist but before etching, after-etching, after deposition, and/or at other times.

There are various techniques for making measurements of the structures formed in the patterning process, including the use of a scanning electron microscope, an image-based measurement tool and/or various specialized tools. As discussed above, a fast and non-invasive form of specialized metrology tool is one in which a beam of radiation is directed onto a target on the surface of the substrate and properties of the scattered (diffracted/reflected) beam are measured. By evaluating one or more properties of the radiation scattered by the substrate, one or more properties of the substrate can be determined. Traditionally, this may be termed diffraction-based metrology. One such application of this diffraction-based metrology is in the measurement of alignment. For example, alignment can be measured by comparing parts of the diffraction spectrum (for example, comparing different diffraction orders in the diffraction spectrum of a periodic grating).

Thus, in a device fabrication process (e.g., a patterning process or a lithography process), a substrate or other objects may be subjected to various types of measurement during or after the process. The measurement may determine whether a particular substrate is defective, may establish adjustments to the process and apparatuses used in the process (e.g., aligning two layers on the substrate or aligning the patterning device to the substrate), may measure the performance of the process and the apparatuses, or may be for other purposes. Examples of measurement include optical imaging (e.g., optical microscope), non-imaging optical measurement (e.g., measurement based on diffraction such as the ASML YieldStar metrology tool, the ASML SMASH metrology system), mechanical measurement (e.g., profiling using a stylus, atomic force microscopy (AFM)), and/or non-optical imaging (e.g., scanning electron microscopy (SEM)). The SMASH (SMart Alignment Sensor Hybrid) system, as described in U.S. Pat. No. 6,961,116, which is incorporated by reference herein in its entirety, employs a self-referencing interferometer that produces two overlapping and relatively rotated images of an alignment marker, detects intensities in a pupil plane where Fourier transforms of the images are caused to interfere, and extracts the positional information from the phase difference between diffraction orders of the two images which manifests as intensity variations in the interfered orders.

Metrology results may be provided directly or indirectly to the supervisory control system SCS. If an error is detected, an adjustment may be made to exposure of a subsequent substrate (especially if the inspection can be done soon and fast enough that one or more other substrates of the batch are still to be exposed) and/or to subsequent exposure of the exposed substrate. Also, an already exposed substrate may be stripped and reworked to improve yield, or discarded, thereby avoiding performing further processing on a substrate known to be faulty. In a case where only some target portions of a substrate are faulty, further exposures may be performed only on those target portions which meet specifications. Other manufacturing process adjustments are contemplated.

A metrology system may be used to determine one or more properties of the substrate structure, and in particular, how one or more properties of different substrate structures vary, or different layers of the same substrate structure vary from layer to layer. The metrology system may be integrated into the lithographic apparatus LA or the lithocell LC, or may be a stand-alone device.

To enable the metrology, often one or more targets are specifically provided on the substrate. A target may include an alignment mark, for example, and/or other targets. In an embodiment, the target is specially designed and may comprise a periodic structure. In an embodiment, the target is a part of a device pattern, e.g., a periodic structure of the device pattern. In an embodiment, the target on a substrate may comprise one or more 1-D periodic structures (e.g., geometric features such as gratings), which are printed such that after development, the periodic structural features are formed of solid resist lines. In an embodiment, the target may comprise one or more 2-D periodic structures (e.g., gratings), which are printed such that after development, the one or more periodic structures are formed of solid resist pillars or vias in the resist. The bars, pillars, or vias may alternatively be etched into the substrate (e.g., into one or more layers on the substrate).

Figure 3:
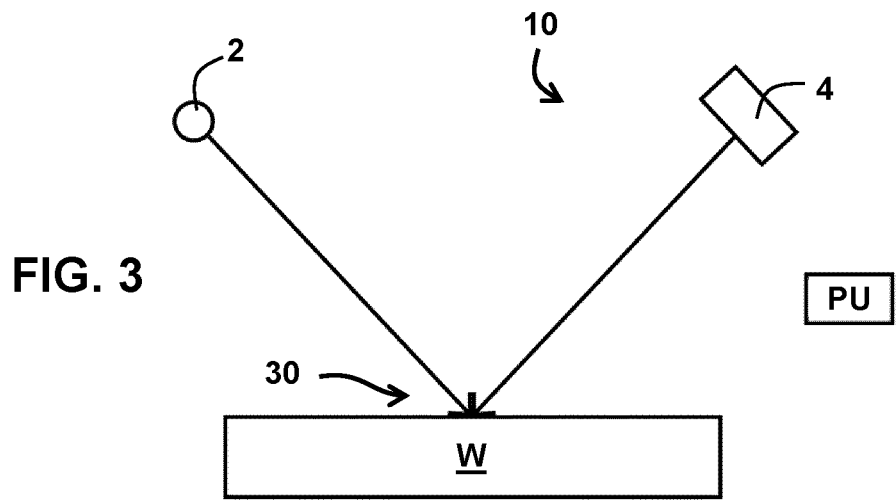
FIG. 3 schematically depicts an example inspection system, according to an embodiment.
Figure 4:
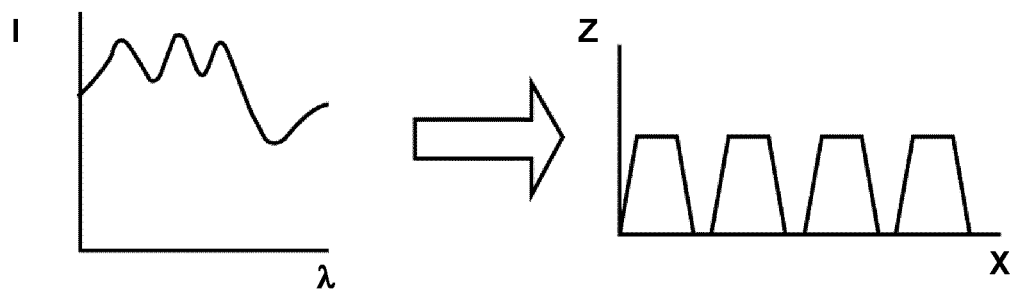
FIG. 4 schematically depicts an example metrology technique, according to an embodiment.

FIG. 3 depicts an example inspection system 10 that may be used to detect alignment and/or perform other metrology operations. It comprises a radiation source projector 2 which projects or otherwise irradiates radiation onto a substrate W (e.g., which may include an alignment mark). The redirected radiation is passed to a sensor such as a spectrometer detector 4 and/or other sensors, which measures a spectrum (intensity as a function of wavelength) of the specular reflected and/or diffracted radiation, as shown, e.g., in the graph on the left of FIG. 4. The sensor may generate an alignment signal conveying alignment data indicative of properties of the reflected radiation. From this data, the structure or profile giving rise to the detected spectrum may be reconstructed by one or more processors PU, a generalized example of which is shown in FIG. 4, or by other operations.

As in the lithographic apparatus LA in FIG. 1, one or more substrate tables (not shown in FIG. 3) may be provided to hold the substrate W during measurement operations. The one or more substrate tables may be similar or identical in form to the substrate table WT of FIG. 1. In an example where inspection system 10 is integrated with the lithographic apparatus, they may even be the same substrate table. Coarse and fine positioners may be provided and configured to accurately position the substrate in relation to a measurement optical system. Various sensors and actuators are provided, for example, to acquire the position of a target portion of interest of a structure (e.g., an alignment mark), and to bring it into position under an objective lens. Typically, many measurements will be made on target portions of a structure at different locations across the substrate W. The substrate support can be moved in X and Y directions to acquire different targets, and in the Z direction to obtain a desired location of the target portion relative to the focus of the optical system. It is convenient to think and describe operations as if the objective lens is being brought to different locations relative to the substrate, when, for example, in practice the optical system may remain substantially stationary (typically in the X and Y directions, but perhaps also in the Z direction) and the substrate moves. Provided the relative position of the substrate and the optical system is correct, it does not matter in principle which one of those is moving in the real world, or if both are moving, or a combination of a part of the optical system is moving (e.g., in the Z and/or tilt direction) with the remainder of the optical system being stationary and the substrate is moving (e.g., in the X and Y directions, but also optionally in the Z and/or tilt direction).

For typical alignment measurements, a target (portion) 30 on substrate W may be a 1-D grating, which is printed such that after development, the bars are formed of solid resist lines (e.g., which may be covered by a deposition layer), and/or other materials. Or, the target 30 may be a 2-D grating, which is printed such that after development, the grating is formed of solid resist pillars, and/or other features in the resist.

The bars, pillars, vias, and/or other features may be etched into or on the substrate (e.g., into one or more layers on the substrate), deposited on a substrate, covered by a deposition layer, and/or have other properties. Target (portion) 30 (e.g., of bars, pillars, vias, etc.) is sensitive to changes in processing in the patterning process (e.g., optical aberration in the lithographic projection apparatus such as in the projection system, focus change, dose change, etc.) such that process variation manifests in variation in target 30. Accordingly, the measured data from target 30 may be used to determine an adjustment for one or more of the manufacturing processes, and/or used as a basis for making the actual adjustment.

For example, the measured data from target 30 may indicate alignment for a layer of a semiconductor device. The measured data from target 30 may be used (e.g., by the one or more processors) for determining one or more semiconductor device manufacturing process parameters based the alignment, and determining an adjustment for a semiconductor device manufacturing apparatus based on the one or more determined semiconductor device manufacturing process parameters. In some embodiments, this may comprise a stage position adjustment, for example, or this may include determining an adjustment for a mask design, a metrology target (e.g., an alignment mark) design, a semiconductor device design, an intensity of the radiation, an incident angle of the radiation, a wavelength of the radiation, a pupil size and/or shape, a resist material, and/or other process parameters.

Angle resolved scatterometry is useful in the measurement of asymmetry of features in product and/or resist patterns. A particular application of asymmetry measurement is for the measurement of alignment. The base concepts of asymmetry measurement using system 10 of FIG. 3 are described, for example, in U.S. patent application publication US2006-066855, which is incorporated herein in its entirety. In brief, for an alignment measurement, the positions of the diffraction orders in the diffraction spectrum of the target are determined by the periodicity of the target (e.g., alignment mark). Asymmetry in the diffraction spectrum is indicative of asymmetry in the individual features which make up the target.

Figure 5:
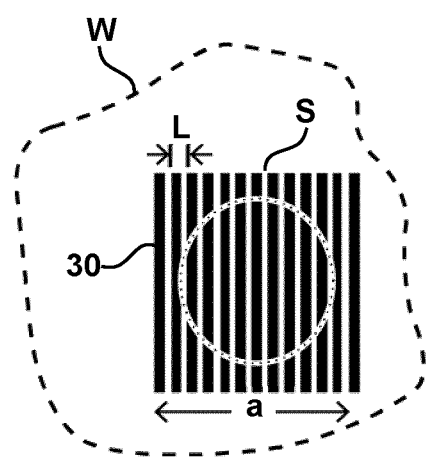
FIG. 5 illustrates the relationship between an illumination spot of an inspection system and a metrology target, according to an embodiment.

FIG. 5 illustrates a plan view of a typical target (e.g., alignment mark) 30, and the extent of illumination spot S in the system of FIG. 3. Typically, to obtain a diffraction spectrum that is free of interference from surrounding structures, the target 30, in an embodiment, is a periodic structure (e.g., grating) larger than the width (e.g., diameter) of the illumination spot S. The width of spot S may be smaller than the width and length of the target. The target, in other words, is 'underfilled' by the illumination, and the diffraction signal is essentially free from any signals from product features and the like outside the target itself. The illumination arrangement may be configured to provide illumination of a uniform intensity across a back focal plane of an objective, for example. Alternatively, by, for example, including an aperture in the illumination path, illumination may be restricted to on axis or off axis directions.

As described above, alignment is typically determined for an alignment mark as a whole. The determined alignment is often based on information conveyed by radiation reflected from the whole alignment mark. However, alignment marks often have local (intra-mark) dimensional distortions (e.g., dimensions that deviate from an intended design), that create local alignment mark asymmetries. For example, an angle of a sidewall that forms part of the alignment mark may be unintentionally tilted in a given area, and/or other local dimensional distortions may occur. The local alignment mark dimensional distortions and/or asymmetries are not accounted for during typical alignment determination. This may limit the accuracy of a typical alignment determination.

In contrast, the present system(s) and method(s) reduce the impact of local alignment mark dimensional deformations on an alignment determination, and thereby enhance the accuracy of the alignment determination. The present system(s) and method(s) are configured to detect local dimensional distortions of an alignment mark and weight an alignment signal based on the local dimensional distortions. The local dimensional distortions are detected based on phase and/or amplitude shifts in radiation reflected from an alignment mark. The weighting is configured such that more symmetrical areas of an alignment mark are more influential (e.g., weighted heavier) on the alignment determination compared to less symmetrical areas of the alignment mark.

Figure 6:
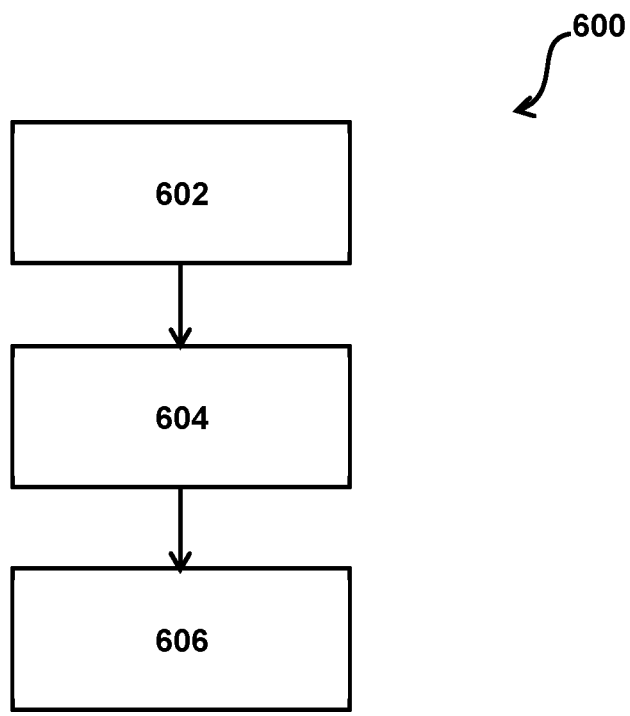
FIG. 6 illustrates a method for generating an alignment signal, according to an embodiment.
Figure 10:
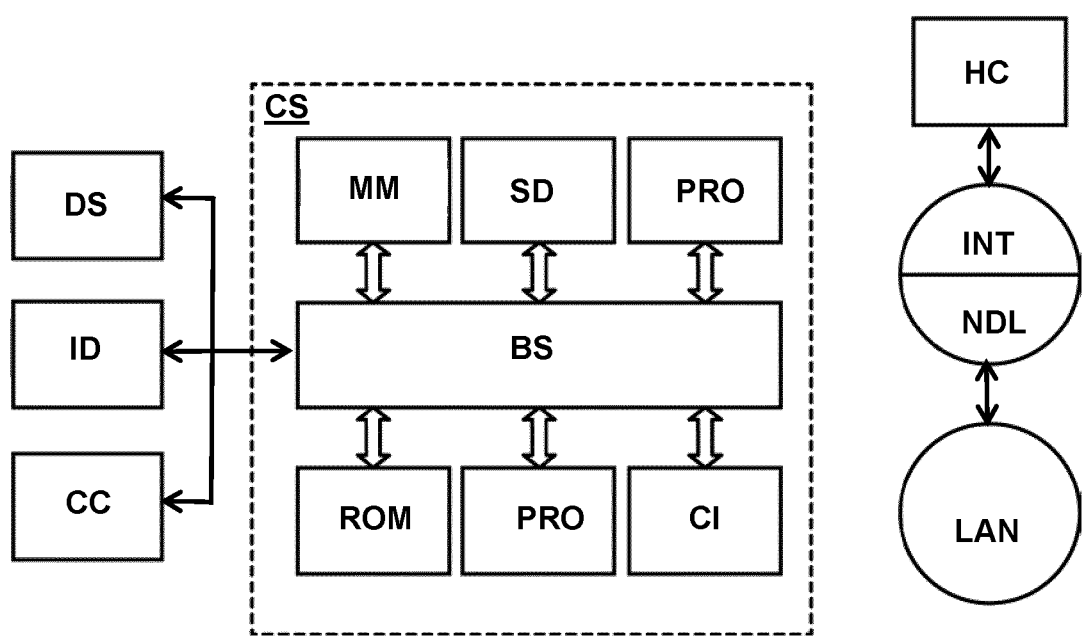
FIG. 10 is a block diagram of an example computer system, according to an embodiment.

FIG. 6 illustrates a method 600 for generating an alignment signal. In some embodiments, generating the alignment signal is performed as part of a semiconductor device manufacturing process. In some embodiments, one or more operations of method 600 may be implemented in or by system 10 illustrated in FIGS. 3 and 4, a computer system (e.g., as illustrated in FIG. 10 and described below), and/or in or by other systems, for example. In some embodiments, method 600 comprises detecting 602 one or more local dimensional distortions of an alignment mark, generating 604 the alignment signal based on the alignment mark, determining 606 an adjustment for the semiconductor device manufacturing process, and/or other operations. Method 600 is described below in the context of alignment, but this is not intended to be limiting. Method 600 may be generally applied to a number of different processes.

The operations of method 600 presented below are intended to be illustrative. In some embodiments, method 600 may be accomplished with one or more additional operations not described, and/or without one or more of the operations discussed. For example, in some embodiments, method 600 need not include determining an adjustment for the semiconductor device manufacturing process. Additionally, the order in which the operations of method 600 are illustrated in FIG. 6 and described below is not intended to be limiting.

In some embodiments, one or more portions of method 600 may be implemented in and/or controlled by one or more processing devices (e.g., a digital processor, an analog processor, a digital circuit designed to process information, an analog circuit designed to process information, a state machine, and/or other mechanisms for electronically processing information). The one or more processing devices may include one or more devices executing some or all of the operations of method 600 in response to instructions stored electronically on an electronic storage medium. The one or more processing devices may include one or more devices configured through hardware, firmware, and/or software to be specifically designed for execution of one or more of the operations of method 600 (e.g., see discussion related to FIG. 10 below).

Operation 602 comprises detecting one or more local dimensional distortions of an alignment mark. The alignment mark may be included in a layer of a substrate in a semiconductor device structure, for example. In some embodiments, the alignment mark comprises a geometric feature such as a 1D or 2D grating, and/or other geometric features. The one or more local dimensional distortions of the alignment mark may be detected using principles of interferometry and/or other principles.

Detecting the one or more local dimensional distortions comprises irradiating the alignment mark with radiation. The radiation may have a target wavelength and/or wavelength range, a target intensity, and/or other characteristics. The target wavelength and/or wavelength range, the target intensity, etc., may be entered and/or selected by a user, determined by the system based on previous alignment measurements, and/or determined in other ways. In some embodiments, the radiation comprises light and/or other radiation. In some embodiments, the light comprises visible light, infrared light, near infrared light, and/or other light. In some embodiments, the radiation may be any radiation appropriate for interferometry.

The radiation may be generated by a radiation source (e.g., projector 2 shown in FIGS. 3 and 4 and described above). In some embodiments, the radiation may be directed by the radiation source onto the whole alignment mark, sub-portions (e.g., something less than the whole) of the alignment mark, and/or onto the alignment mark in other ways. In some embodiments, the radiation may be directed by the radiation source onto the alignment mark in a time varying manner. For example, the radiation may be rastered over an alignment mark such that different portions of the alignment mark are irradiated at different times. As another example, characteristics of the radiation (e.g., wavelength, intensity, etc.) may be varied. This may create time varying data envelopes, or windows, for analysis. The data envelopes may facilitate analysis of individual sub-portions of the alignment mark, comparison of one portion of an alignment mark to another, and/or other analysis.

Detecting one or more local dimensional distortions of the alignment mark comprises detecting one or more phase and/or amplitude shifts in reflected radiation from one or more geometric features of an alignment mark. The one or more phase and/or amplitude shifts correspond to one or more local dimensional distortions of a geometric feature. For example, the phase and/or amplitude of reflected radiation from a distorted portion of a geometric feature of an alignment mark is different relative to the phase and/or amplitude of reflected radiation from an undistorted portion of the mark.

Figure 7:
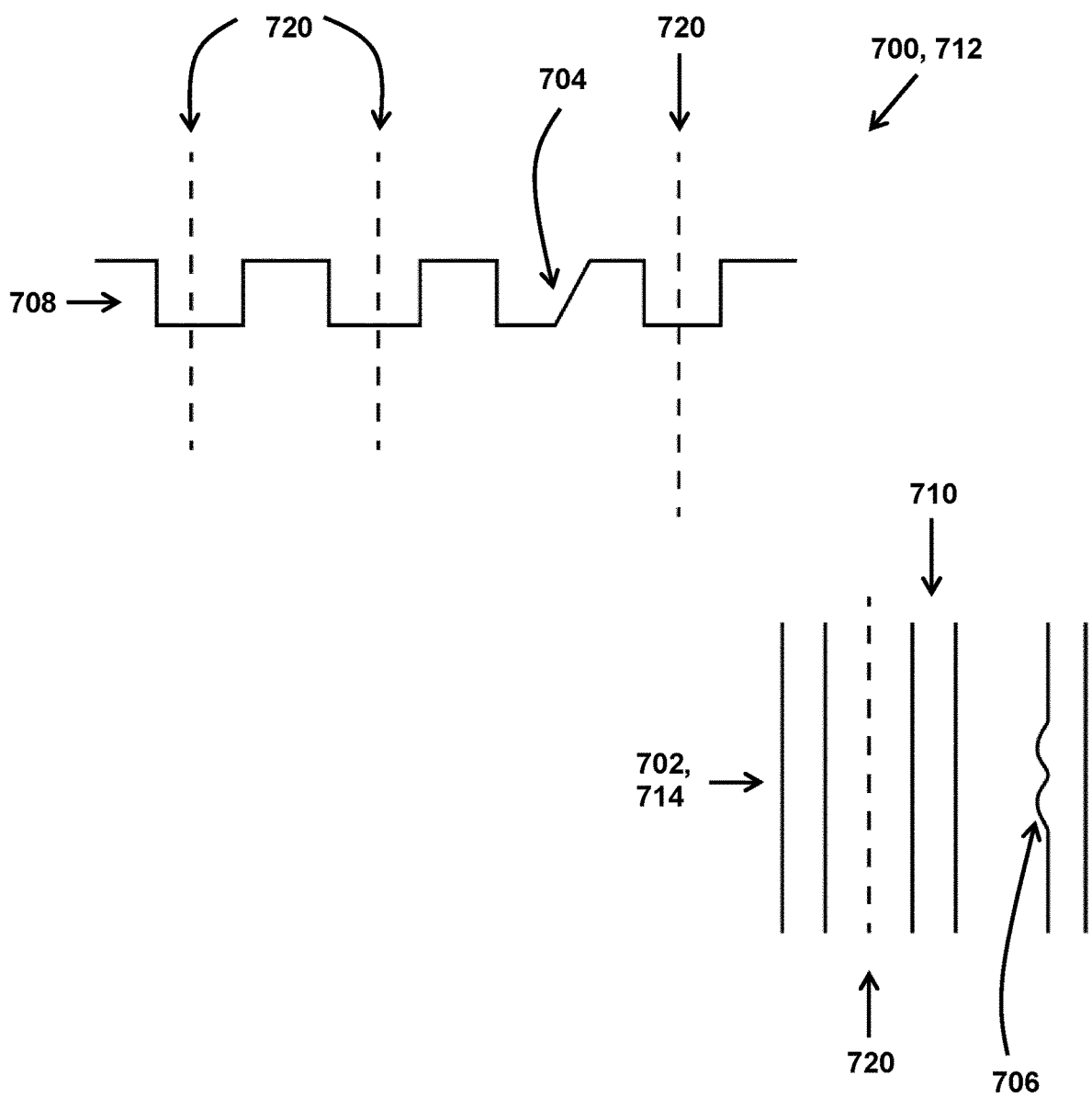
FIG. 7 illustrates examples of local dimensional distortions of geometric features in alignment marks, according to an embodiment.

FIG. 7 illustrates examples 700, 702 of local dimensional distortions 704, 706 of geometric features 708, 710 in alignment marks 712, 714. Geometric features 708, 710 both comprise grating structures. Example 700 shows a side view of grating structure/geometric feature 708. Example 702 shows a top view of grating structure/geometric feature 710. As shown in FIG. 7, geometric features 708, 710 have symmetrical portions 720 that do not have local dimensional distortions. However, geometric feature 708 includes location dimensional distortion 704, comprising a sidewall that was unintentionally tilted. The tilted sidewall does not match the angle of the opposing sidewall in the grating, for example, creating an asymmetry. Geometric feature 710 includes dimensional distortion 706, comprising a sidewall that has unintentionally deviated from an intended location. The sidewall is not straight and does not match the straightness of the opposing sidewall, for example. As described above, one or more phase and/or amplitude shifts corresponding to local dimensional distortions 704, 706 of geometric features 708, 710 would be detected in radiation reflected from alignment marks 712, 714.

Returning to FIG. 6, detecting the one or more phase and/or amplitude shifts in the reflected radiation from the geometric feature comprises measuring local phase shifts (e.g., local phase deltas) and/or amplitude variations that correspond to the local dimensional distortions. For example, the reflected radiation from a specific area of an alignment mark may comprise a sinusoidal waveform having a certain phase and/or amplitude. The reflected radiation from a different area of the alignment mark (e.g., an area with a dimensionally distorted geometric feature) may also comprise a sinusoidal waveform, but one with a different phase and/or amplitude. Detecting the one or more local phase and/or amplitude shifts in the reflected radiation from the geometric feature comprises measuring a phase and/or amplitude difference in reflected radiation of different diffraction orders. Detecting the one or more local phase and/or amplitude shifts may be performed using Hilbert transformations, for example, and/or other techniques. Interferometry techniques and/or other operations may be used to measure phase and/or amplitude differences in reflected radiation of different diffraction orders.

To detect a local phase shift, a Fourier Transform Fit (FFT) and Hilbert transform are applied per window (each window is one period of the signal). Real and imaginary parts of the signal are generated by the FFT and Hilbert transform. The signal phase is calculated as arc tangent (arctan) of the imaginary/real ratio, where amplitude is the magnitude of imaginary/real part vector. The alignment signal has local phase/amplitude variation over the signal. The diffracted signal has less local phase/amplitude variation versus the one with local asymmetry.

Operation 604 comprises generating the alignment signal based on the alignment mark. The alignment signal comprises an electronic signal that represents and/or otherwise corresponds to the radiation reflected from the geometric feature(s) of the alignment mark. The alignment signal may indicate an alignment value for the alignment mark, for example, and/or other information. Generating the alignment signal comprises sensing the reflected radiation and converting the sensed reflected radiation into the electronic signal. In some embodiments, generating the alignment signal comprises sensing different portions of the reflected radiation from different areas and/or different geometric features of the alignment mark, and combining the different portions of the reflected radiation to form the alignment signal. This sensing and converting may be performed by components similar to and/or the same as detector 4, detector 18, and/or processors PU shown in FIG. 3 and FIG. 4, and/or other components.

Generating the alignment signal based on the alignment mark comprises determining one or more areas of the geometric feature(s) that are relatively more symmetrical, or conversely less dimensionally distorted, than other areas of the geometric feature(s). These areas are determined based on the one or more detected phase and/or amplitude shifts, and/or other information. For example, the detected phase and/or amplitude shifts in the reflected radiation correspond to local dimensional distortions in a geometric feature of an alignment mark (e.g., as described above related to FIG. 7). Portions of the reflected radiation without, and/or with reduced, phase and/or amplitude shifts correspond to areas/ geometric features of the alignment mark without, and/or with minimal, local dimensional distortions. In other words, portions of the reflected radiation without, and/or with reduced, phase and/or amplitude shifts correspond to symmetrical (non-distorted) areas/geometric features of the alignment mark.

In some embodiments, determining one or more areas of the geometric feature(s) that are relatively more symmetrical, or conversely less dimensionally distorted, than other areas of the geometric feature(s), may comprising directly measuring the dimensions of a geometric feature of an alignment mark. For example, direct dimensional measurements of an alignment mark may be made with a scatterometer and/or other systems. In some embodiments, direct dimensional measurements may be used in combination with, and/or instead of the local phase and/or amplitude shifts described herein, to determine the one or more areas of the geometric feature(s) that are relatively more symmetrical, or conversely less dimensionally distorted, than other areas of the geometric feature(s). For example, output dimensional measurements from the scatterometer system may be provided to processor PU (FIG. 3) and/or other system components, which may generate the alignment signal based at least in part on the output dimensional measurements from the scatterometer system.

Operation 604 comprises weighting the alignment signal. The alignment signal is weighted based on the one or more local dimensional distortions, and/or symmetrical/non-symmetrical geometric features, of the alignment mark, and/or other information. One or more portions of the reflected radiation signal that correspond to radiation reflected from the one or more relatively more symmetrical (less dimensionally distorted) areas of the alignment mark are weighted heavier than other portions of the reflected radiation signal. In some embodiments, one or more portions of the reflected radiation signal that correspond to radiation reflected from relatively less symmetrical (more dimensionally distorted) areas of the alignment mark may be given little to no weight at all. This way, when the different portions of the reflected radiation are combined into the electronic signal that represents the reflected radiation, an alignment value indicated by the electronic signal is based heavily (and/or even totally) on radiation reflected from symmetrical (less dimensionally distorted) areas of the geometric feature(s) of the alignment mark. An example of a weighing function can be for instance: inversely proportional to the measured intensity asymmetry (or amplitude asymmetry) of the positive and negative diffraction order.

Operation 606 comprises determining 606 an adjustment for the semiconductor device manufacturing process. In some embodiments, operation 606 includes determining one or more semiconductor device manufacturing process parameters. The one or more semiconductor device manufacturing process parameters may be determined based on the one or more detected phase and/or amplitude asymmetry variations, an alignment value indicated by the alignment signal, dimensions determined by a scatterometer system, and/or other similar systems, and/or other information. The one or more parameters may include a parameter of the radiation (the radiation used for determining alignment), an alignment inspection location within a geometric feature, an alignment inspection location on a layer of a semiconductor device structure, a radiation beam trajectory across a geometric feature, and/or other parameters. In some embodiments, process parameters can be interpreted broadly to include a stage position, a mask design, a metrology target (e.g., an alignment mark) design, a semiconductor device design, an intensity of the radiation (used for exposing resist, etc.), an incident angle of the radiation (used for exposing resist, etc.), a wavelength of the radiation (used for exposing resist, etc.), a pupil size and/or shape, a resist material, and/or other parameters.

A parameter of the radiation used for determining alignment may include a wavelength, an intensity, an angle of incidence, and/or parameters of the radiation. These parameters may be adjusted to better measure geometric features with specific shapes, enhance the intensity of reflected radiation, increase and/or otherwise enhance (e.g., maximize) the phase and/or amplitude shifts (if any) in reflected radiation from one area of the alignment mark to the next, and/or for other purposes. This may enable and/or enhance detection of more subtle dimensional deviations, make the phase and/or amplitude shifts easier to detect, and/or have other advantages.

In some embodiments, the local phase and/or amplitude shifts, data from a scatterometer system and/or other similar systems, and/or other information, may be used as a key performance indicator that flags inter and/or intra-mark variations (dimensional deviations), and can be used to perform real-time mark, and/or within mark geometric feature, selection. Alignment may be determined based on these selections.

For example, an alignment inspection location within a geometric feature may comprise a specific location in a geometric feature, relative to other possible locations. The specific location may comprise an edge, a corner, a portion of a line, and/or other locations. The specific location may be determined to be consistently more symmetrical (less dimensionally distorted or not distorted at all) relative to other locations, and thus facilitate a more accurate determination of alignment based on radiation reflected from that specific location. For example, if a specific location in a geometric feature is determined to be consistently more symmetrical based on the detected phase and/or amplitude shifts, that specific location in the geometric feature may used across different alignment marks for determining alignment.

An alignment inspection location on a layer of a semiconductor device structure may comprise a specific alignment mark relative to other alignment marks, and/or other inspection locations. For example, if a specific alignment mark in a given layer is determined to be more symmetrical than other alignment marks in the layer based on the detected phase and/or amplitude shifts (e.g., the reflected radiation from that alignment mark includes less, and/or less pronounced, phase and/or amplitude shifts), that specific alignment mark may be used for determining alignment for that layer. Other, less symmetric alignment marks in that layer, may or may not be used. Corresponding alignment marks may also be used to determine alignment for later layers, for example.

A radiation beam trajectory across the geometric feature may comprise a pathway the radiation beam follows when it is rastered across an alignment mark. The pathway may connect areas of a geometric feature/alignment mark that are relatively more symmetrical than other areas. The pathway may be an optimal route across an alignment mark for measuring alignment that avoids large asymmetries. For example, the radiation beam may be controlled to avoid areas of an alignment mark where local dimensional deviations in a geometric feature are detected (e.g., based on the local phase and/or amplitude shifts, the ASML YieldStar output, and/or other information, as described herein). The radiation beam trajectory may be fed to measurement systems such as the ASML SMASH and/or Orion systems, for example.

In some embodiments, controlling the radiation beam to avoid areas of an alignment mark where local dimensional deviations are detected may include mapping dimensional deviations for different x and/or y positions across a geometric feature of an alignment mark (and/or across the alignment mark as a whole) to look for optimized (more symmetrical) measurement areas. In some embodiments, this may include generating a two dimensional map of weights for portions of the radiation reflected from the alignment mark.

Figure 8:
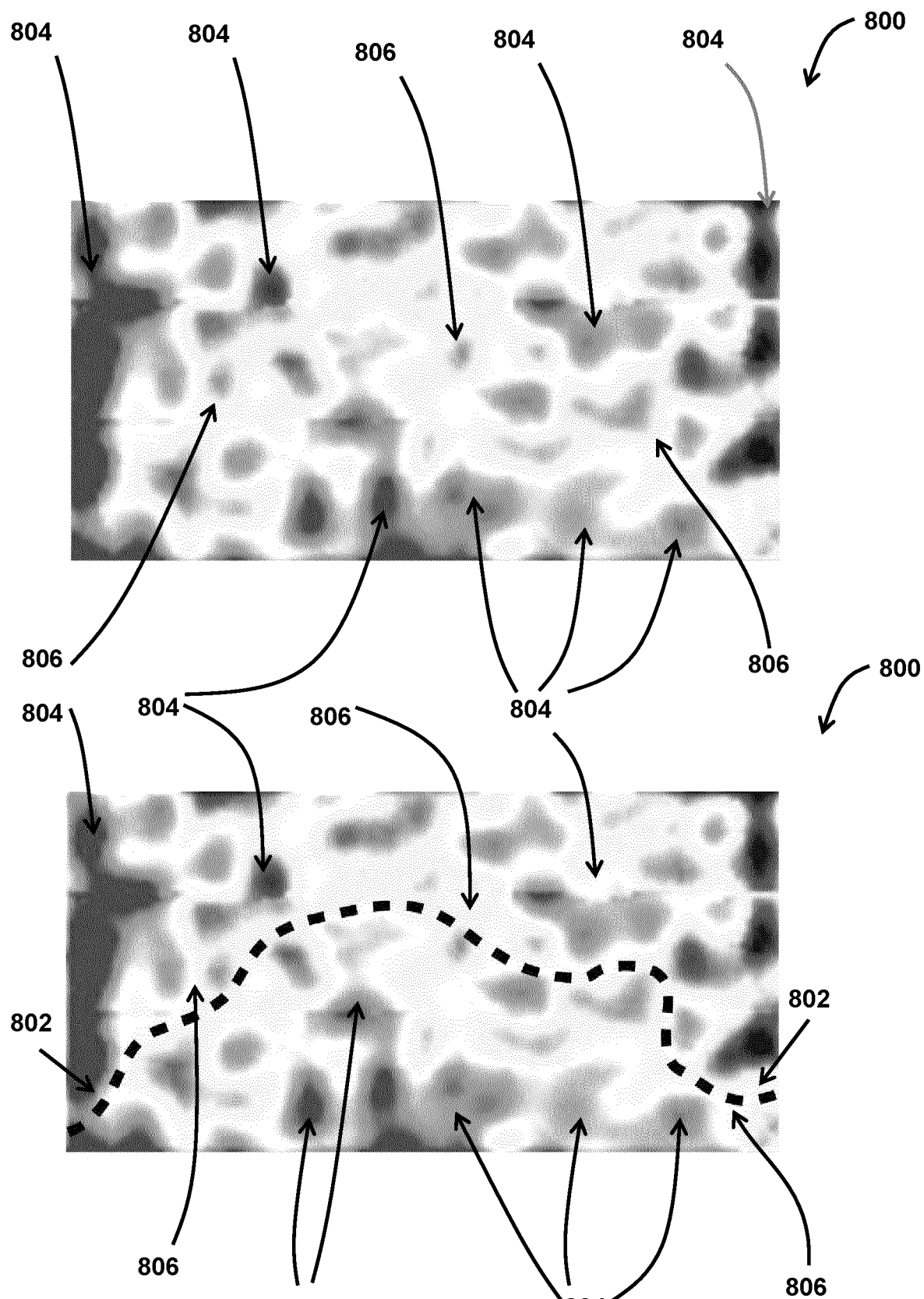
FIG. 8 illustrates a two dimensional map of weights for portions of radiation reflected from an alignment mark, and an example radiation beam trajectory across the alignment mark, according to an embodiment.

FIG. 8 illustrates an example two dimensional map 800 of alignment signal weights (e.g., determined as described above) for portions of radiation reflected from a geometric feature of an alignment mark, and an example radiation beam trajectory 802 across the geometric feature/alignment mark. Different alignment signal weights are shown using different shading levels. In FIG. 8, areas 804 illustrate weights that correspond to less symmetrical (more dimensionally distorted) areas of the alignment mark. Areas 806 illustrate weights that correspond to more symmetrical (less dimensionally distorted) areas of the alignment mark. As shown in FIG. 8, trajectory 802 connects areas 806 of the alignment mark that are relatively more symmetrical than other areas.

Returning to FIG. 6, in some embodiments, operation 606 includes determining a process adjustment based on the one or more determined semiconductor device manufacturing process parameters, adjusting a semiconductor device manufacturing apparatus based on the determined adjustment, and/or other operations. For example, if a determined alignment is not within process tolerances, the misalignment may be caused by one or more manufacturing processes whose process parameters have drifted and/or otherwise changed so that the process is no longer producing acceptable devices (e.g., alignment measurements may breach a threshold for acceptability). One or more new or adjusted process parameters may be determined based on the alignment determination. The new or adjusted process parameters may be configured to cause a manufacturing process to again produce acceptable devices. For example, a new or adjusted process parameter may cause a previously unacceptable alignment (or misalignment) to be adjusted back into an acceptable range. The new or adjusted process parameters may be compared to existing parameters for a given process. If there is a difference, that difference may be used to determine an adjustment for an apparatus that is used to produce the devices (e.g., parameter "x" should be increased/decreased/changed so that it matches the new or adjusted version of parameter "x" determined as part of operation 606), for example. In some embodiments, operation 606 may include electronically adjusting an apparatus (e.g., based on the determined process parameters). Electronically adjusting an apparatus may include sending an electronic signal, and/or other communications to the apparatus, for example, that causes a change in the apparatus. The electronic adjustment may include changing a setting on the apparatus, for example, and/or other adjustments.

Figure 9:
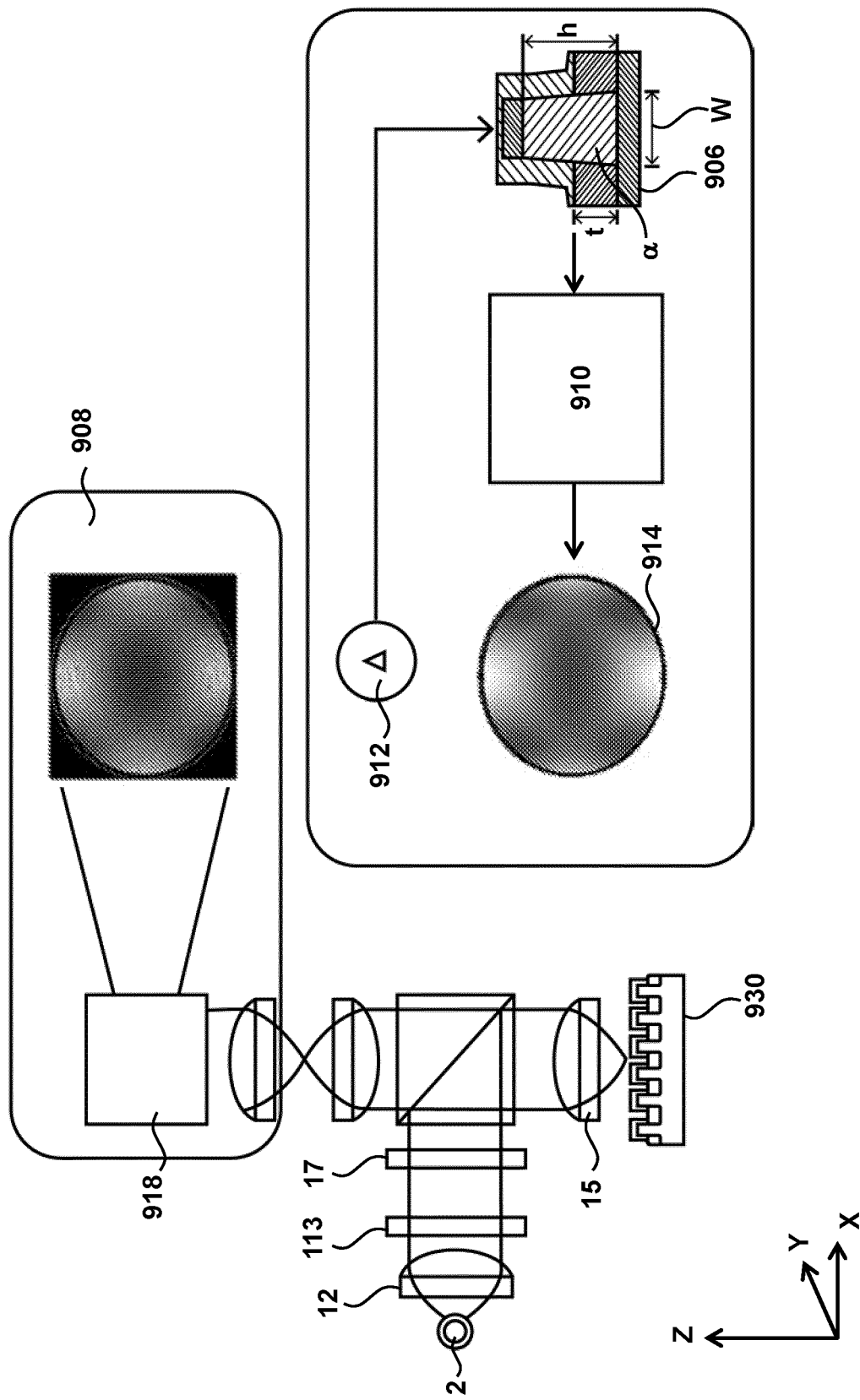
FIG. 9 schematically depicts a process of deriving a plurality of variables of interest based on measurement data, according to an embodiment.

FIG. 9 schematically depicts an example process of determining an adjustment for the semiconductor device manufacturing process (e.g., an adjustment for a parameter of the process) based on measurement data obtained using metrology (e.g., alignment determined with the present systems and methods). Radiation detected by the detector 918 provides a measured radiation distribution 908 for target (e.g., alignment mark) 930, which can be used for determining alignment, etc. as described herein. For a given target 930, a radiation distribution 914, alignment, etc., can be computed/simulated from a parameterized model 906 using, for example, a numerical Maxwell solver 910. The parameterized model 906 shows example layers of various materials making up, and associated with, the target. The parameterized model 906 may include one or more of variables for the features and layers of the portion of the target under consideration, which may be varied and derived. As shown in FIG. 9, the one or more of the variables may include the thickness t of one or more layers, a width w (e.g., CD) of one or more features, a height h of one or more features, and/or a sidewall angle $\alpha$ of one or more features. Although not shown, the one or more of the variables may further include, but is not limited to, the refractive index (e.g., a real or complex refractive index, refractive index tensor, etc.) of one or more of the layers, the extinction coefficient of one or more layers, the absorption of one or more layers, resist loss during development, a footing of one or more features, and/or line edge roughness of one or more features. The initial values of the variables may be those expected for the target being measured. The measured radiation distribution 908, alignment, etc., is then compared to the computed radiation distribution 912, alignment, etc., to determine the difference between the two. If there is a difference, the values of one or more of the variables of the parameterized model 906 may be varied, a new computed radiation distribution 912, alignment, etc. calculated and compared against the measured radiation distribution 908, alignment, etc., until there is sufficient match between the measured radiation distribution 908, alignment, etc., and the computed radiation distribution 912, alignment, etc. At that point, the values of the variables of the parameterized model 906 provide a good or best match of the geometry of the actual target 930. In an embodiment, there is sufficient match when a difference between the measured radiation distribution 908, alignment, etc., and the computed radiation distribution 912, alignment, etc., is within a tolerance threshold.

FIG. 10 is a diagram of an example computer system CS that may be used for one or more of the operations described herein. Computer system CS includes a bus BS or other communication mechanism for communicating information, and a processor PRO (or multiple processors) coupled with bus BS for processing information. Computer system CS also includes a main memory MM, such as a random access memory (RAM) or other dynamic storage device, coupled to bus BS for storing information and instructions to be executed by processor PRO. Main memory MM also may be used for storing temporary variables or other intermediate information during execution of instructions by processor PRO. Computer system CS further includes a read only memory (ROM) ROM or other static storage device coupled to bus BS for storing static information and instructions for processor PRO. A storage device SD, such as a magnetic disk or optical disk, is provided and coupled to bus BS for storing information and instructions.

Computer system CS may be coupled via bus BS to a display DS, such as a cathode ray tube (CRT) or flat panel or touch panel display for displaying information to a computer user. An input device ID, including alphanumeric and other keys, is coupled to bus BS for communicating information and command selections to processor PRO. Another type of user input device is cursor control CC, such as a mouse, a trackball, or cursor direction keys for communicating direction information and command selections to processor PRO and for controlling cursor movement on display DS. This input device typically has two degrees of freedom in two axes, a first axis (e.g., x) and a second axis (e.g., y), that allows the device to specify positions in a plane. A touch panel (screen) display may also be used as an input device.

In some embodiments, portions of one or more methods described herein may be performed by computer system CS in response to processor PRO executing one or more sequences of one or more instructions contained in main memory MM. Such instructions may be read into main memory MM from another computer-readable medium, such as storage device SD. Execution of the sequences of instructions included in main memory MM causes processor PRO to perform the process steps (operations) described herein. One or more processors in a multi-processing arrangement may also be employed to execute the sequences of instructions contained in main memory MM. In some embodiments, hard-wired circuitry may be used in place of or in combination with software instructions. Thus, the description herein is not limited to any specific combination of hardware circuitry and software.

The term "computer-readable medium" as used herein refers to any medium that participates in providing instructions to processor PRO for execution. Such a medium may take many forms, including but not limited to, non-volatile media, volatile media, and transmission media. Non-volatile media include, for example, optical or magnetic disks, such as storage device SD. Volatile media include dynamic memory, such as main memory MM. Transmission media include coaxial cables, copper wire and fiber optics, including the wires that comprise bus BS. Transmission media can also take the form of acoustic or light waves, such as those generated during radio frequency (RF) and infrared (IR) data communications. Computer-readable media can be non-transitory, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge. Non-transitory computer readable media can have instructions recorded thereon. The instructions, when executed by a computer, can implement any of the operations described herein. Transitory computer-readable media can include a carrier wave or other propagating electromagnetic signal, for example.

Various forms of computer readable media may be involved in carrying one or more sequences of one or more instructions to processor PRO for execution. For example, the instructions may initially be borne on a magnetic disk of a remote computer. The remote computer can load the instructions into its dynamic memory and send the instructions over a telephone line using a modem. A modem local to computer system CS can receive the data on the telephone line and use an infrared transmitter to convert the data to an infrared signal. An infrared detector coupled to bus BS can receive the data carried in the infrared signal and place the data on bus BS. Bus BS carries the data to main memory MM, from which processor PRO retrieves and executes the instructions. The instructions received by main memory MM may optionally be stored on storage device SD either before or after execution by processor PRO.

Computer system CS may also include a communication interface CI coupled to bus BS. Communication interface CI provides a two-way data communication coupling to a network link NDL that is connected to a local network LAN. For example, communication interface CI may be an integrated services digital network (ISDN) card or a modem to provide a data communication connection to a corresponding type of telephone line. As another example, communication interface CI may be a local area network (LAN) card to provide a data communication connection to a compatible LAN. Wireless links may also be implemented. In any such implementation, communication interface CI sends and receives electrical, electromagnetic or optical signals that carry digital data streams representing various types of information.

Network link NDL typically provides data communication through one or more networks to other data devices. For example, network link NDL may provide a connection through local network LAN to a host computer HC. This can include data communication services provided through the worldwide packet data communication network, now commonly referred to as the "Internet" INT. Local network LAN (Internet) may use electrical, electromagnetic or optical signals that carry digital data streams. The signals through the various networks and the signals on network data link NDL and through communication interface CI, which carry the digital data to and from computer system CS, are exemplary forms of carrier waves transporting the information.

Computer system CS can send messages and receive data, including program code, through the network(s), network data link NDL, and communication interface CI. In the Internet example, host computer HC might transmit a requested code for an application program through Internet INT, network data link NDL, local network LAN, and communication interface CI. One such downloaded application may provide all or part of a method described herein, for example. The received code may be executed by processor PRO as it is received, and/or stored in storage device SD, or other non-volatile storage for later execution. In this manner, computer system CS may obtain application code in the form of a carrier wave.

Figure 11:
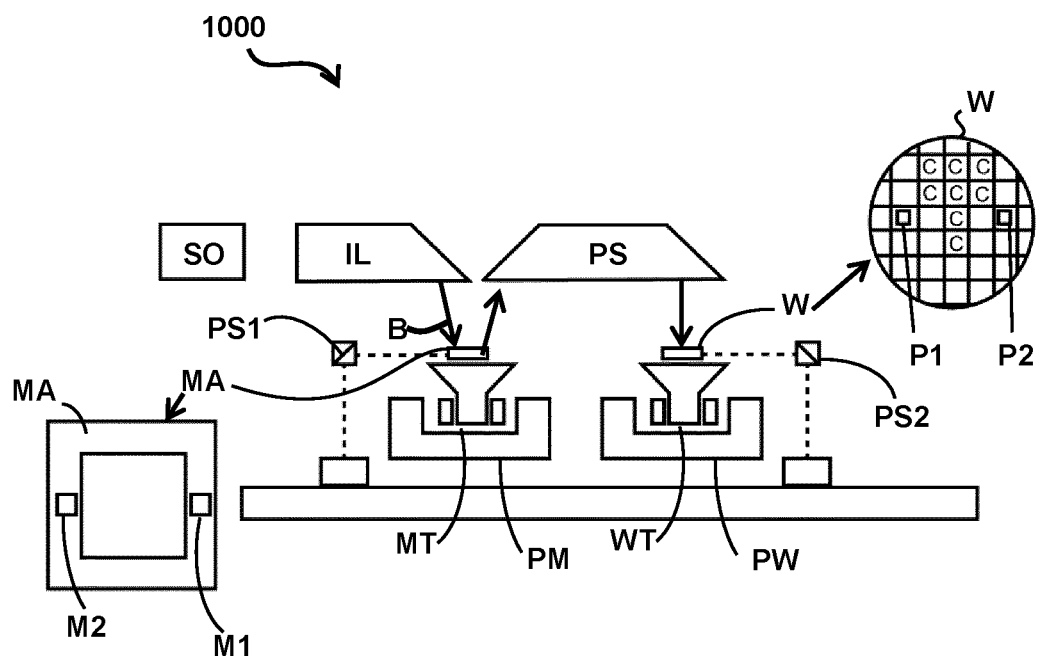
FIG. 11 is a schematic diagram of a lithographic projection apparatus similar to FIG. 1, according to an embodiment.

FIG. 11 schematically depicts an exemplary lithographic projection apparatus similar to and/or the same as the apparatus shown in FIG. 1 that can be used in conjunction with the techniques described herein. The apparatus 1000 comprises an illumination system IL, to condition a beam B of radiation. In this particular case, the illumination system also comprises a radiation source SO; a first object table (e.g., patterning device table) MT provided with a patterning device holder to hold a patterning device MA (e.g., a reticle), and connected to a first positioner PM (working in association with a first position sensor) PS1 to accurately position the patterning device; a second object table (substrate table) WT provided with a substrate holder to hold a substrate W (e.g., a resist-coated silicon wafer), and connected to a second positioner PW (working in association with a second position sensor PS2) to accurately position the substrate; a projection system ("lens") PS (e.g., a refractive, catoptric or catadioptric optical system) to image an irradiated portion of the patterning device MA onto a target portion C (e.g., comprising one or more dies) of the substrate W.

As depicted herein, the apparatus is of a transmissive type (i.e., has a transmissive patterning device). However, in general, it may also be of a reflective type, for example (with a reflective patterning device). The apparatus may employ a different kind of patterning device to classic mask; examples include a programmable mirror array or LCD matrix.

The source SO (e.g., a mercury lamp or excimer laser, LPP (laser produced plasma) EUV source) produces a beam of radiation. This beam is fed into an illumination system (illuminator) IL, either directly or after having traversed conditioning means, such as a beam expander Ex, for example. The illuminator IL may comprise adjusting means for setting the outer and/or inner radial extent (commonly referred to as σ-outer and σ-inner, respectively) of the intensity distribution in the beam. In addition, it will generally comprise various other components, such as an integrator and a condenser. In this way, the beam B impinging on the patterning device MA has a desired uniformity and intensity distribution in its cross-section.

It should be noted with regard to FIG. 11 that the source SO may be within the housing of the lithographic projection apparatus (as is often the case when the source SO is a mercury lamp, for example), but that it may also be remote from the lithographic projection apparatus, the radiation beam that it produces being led into the apparatus (e.g., with the aid of suitable directing mirrors); this latter scenario is often the case when the source SO is an excimer laser (e.g., based on KrF, ArF or $F_2$ lasing).

The beam B subsequently intercepts the patterning device MA, which is held on a patterning device table MT. Having traversed the patterning device MA, the beam B passes through a lens, which focuses the beam B onto a target portion C of the substrate W. With the aid of the second positioning means (and interferometric measuring means), the substrate table WT can be moved accurately, e.g. to position different target portions C in the path of the beam B. Similarly, the first positioning means can be used to accurately position the patterning device MA with respect to the path of the beam B, e.g., after mechanical retrieval of the patterning device MA from a patterning device library, or during a scan. In general, movement of the object tables MT, WT will be realized with the aid of a long-stroke module (coarse positioning) and a short-stroke module (fine positioning), which are not explicitly depicted. However, in the case of a stepper (as opposed to a step-and-scan tool) the patterning device table MT may just be connected to a short stroke actuator, or may be fixed.

The depicted tool (similar to or the same as the tool shown in FIG. 1) can be used in two different modes. In step mode, the patterning device table MT is kept essentially stationary, and an entire patterning device image is projected in one operation (i.e., a single "flash") onto a target portion C. The substrate table WT is then shifted in the x and/or y directions so that a different target portion C can be irradiated by the beam B. In scan mode, essentially the same scenario applies, except that a given target portion C is not exposed in a single "flash". Instead, the patterning device table MT is movable in a given direction (the so-called "scan direction", e.g., the y direction) with a speed v, so that the projection beam B is caused to scan over a patterning device image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 12:
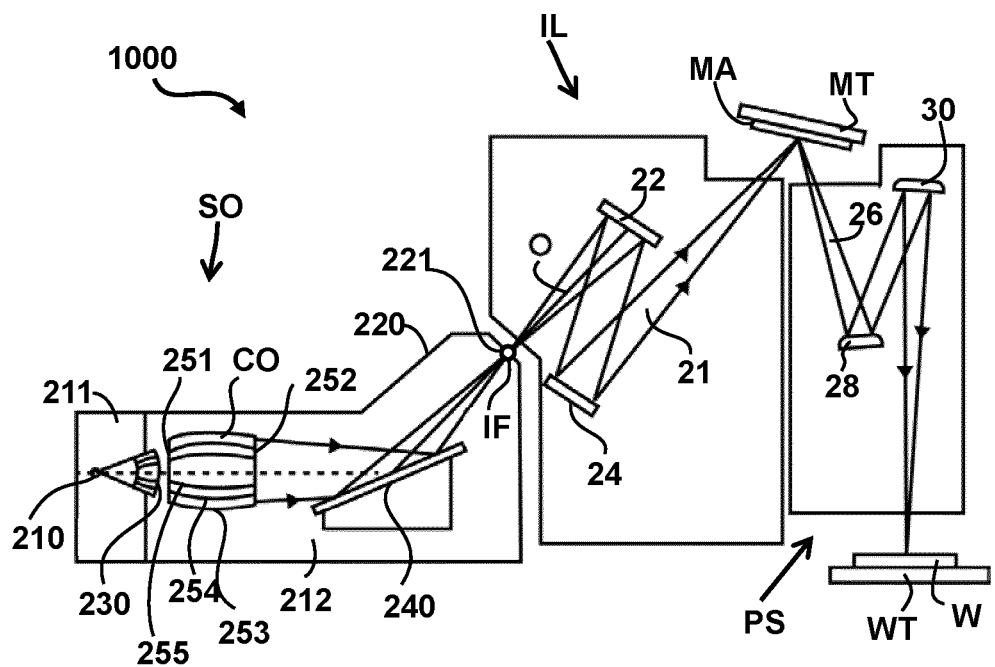
FIG. 12 is a more detailed view of the apparatus in FIG. 11, according to an embodiment.

FIG. 12 shows the apparatus 1000 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the hot plasma 210 is created to emit radiation in the EUV range of the electromagnetic spectrum. The plasma 210 is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap 230 further indicated herein at least includes a channel structure.

The source chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF along the optical axis indicated by the line 'O'. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 330 onto a substrate W held by the substrate table WT.

More elements than shown may generally be present in illumination optics unit IL and projection system PS. The grating spectral filter 240 may optionally be present, depending upon the type of lithographic apparatus. Further, there may be more mirrors present than those shown in the figures, for example there may be 1-6 additional reflective elements present in the projection system PS than shown in FIG. 12.

Collector optic CO, as illustrated in FIG. 12, is depicted as a nested collector with grazing incidence reflectors 253, 254 and 255, just as an example of a collector (or collector mirror). The grazing incidence reflectors 253, 254 and 255 are disposed axially symmetric around the optical axis O and a collector optic CO of this type may be used in combination with a discharge produced plasma source, often called a DPP source.

Figure 13:
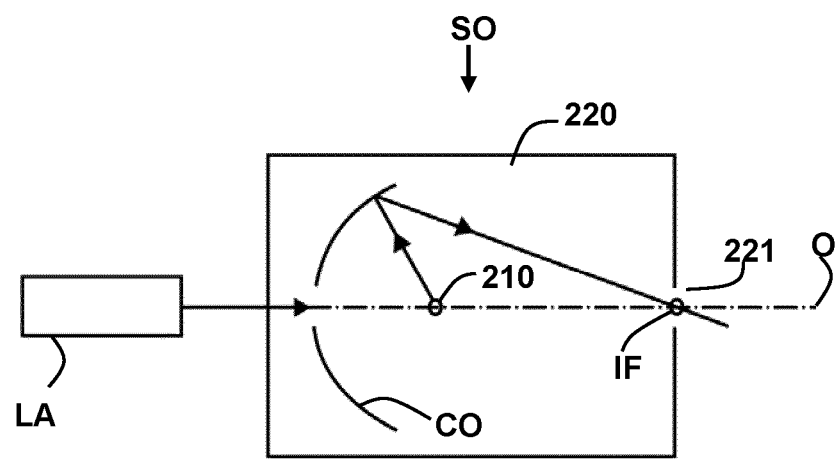
FIG. 13 is a more detailed view of the source collector module of the apparatus of FIG. 11 and FIG. 12, according to an embodiment.

Alternatively, the source collector module SO may be part of an LPP radiation system as shown in FIG. 13. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

The embodiments may further be described using the following clauses.

1. A method for adjusting a semiconductor device manufacturing parameter, the method comprising:
    detecting one or more local dimensional distortions of an alignment mark; and
    generating an alignment signal based on the alignment mark, the alignment signal being weighted based on the one or more local dimensional distortions of the alignment mark, the alignment signal configured to be used to adjust the semiconductor device manufacturing parameter.
2. The method of clause 1, further comprising adjusting the semiconductor device manufacturing parameter based on the alignment signal.
3. The method of clause 1 or 2, wherein the semiconductor device manufacturing parameter is a stage position.
4. The method of any of clauses 1-3, wherein detecting the one or more local dimensional distortions comprises:
    irradiating the alignment mark with radiation, the alignment mark comprising a geometric feature; and
    detecting one or more phase and/or amplitude shifts in reflected radiation from the geometric feature, the one or more phase and/or amplitude shifts corresponding to one or more local dimensional distortions of the geometric feature.
5. The method of clause 4, further comprising determining, based on the one or more detected phase and/or amplitude shifts, one or more of a parameter of the radiation, an alignment inspection location within the geometric feature, an alignment inspection location on a layer of a semiconductor device structure, or a radiation beam trajectory across the geometric feature.
6. A method for generating an alignment signal, the method comprising:
    detecting one or more local dimensional distortions of an alignment mark; and
    generating the alignment signal based on the alignment mark, the alignment signal being weighted based on the one or more local dimensional distortions of the alignment mark.
7. The method of clause 6, wherein detecting the one or more local dimensional distortions comprises:
    irradiating the alignment mark with radiation, the alignment mark comprising a geometric feature; and
    detecting one or more phase and/or amplitude shifts in reflected radiation from the geometric feature, the one or more phase and/or amplitude shifts corresponding to one or more local dimensional distortions of the geometric feature.
8. The method of clause 7, further comprising determining, based on the one or more detected phase and/or amplitude shifts, one or more of a parameter of the radiation, an alignment inspection location within the geometric feature, an alignment inspection location on a layer of a structure, or a radiation beam trajectory across the geometric feature.
9. The method of any of clauses 7-8, wherein the geometric feature comprises a grating.
10. The method of any of clauses 7-9, wherein detecting the one or more phase and/or amplitude shifts in the reflected radiation from the geometric feature comprises measuring a phase difference in reflected radiation of different diffraction orders.
11. The method of any of clauses 7-10, wherein generating the alignment signal comprises:
    determining, based on the one or more detected phase and/or amplitude shifts, one or more areas of the geometric feature that are relatively more symmetrical than other areas of the geometric feature; and
weighting one or more portions of a reflected radiation signal that correspond to radiation reflected from the one or more relatively more symmetrical areas heavier than other portions of the reflected radiation signal.

12. The method of any of clauses 6-11, wherein the alignment mark is included in a layer of a substrate in a semiconductor device structure.

13. The method of clause 12, further comprising adjusting a semiconductor device manufacturing parameter based on the alignment signal.

14. A non-transitory computer readable medium having instructions thereon, the instructions when executed by a computer causing the computer to:
detect one or more local dimensional distortions of an alignment mark; and
generate an alignment signal based on the alignment mark, the alignment signal being weighted based on the one or more local dimensional distortions of the alignment mark.

15. The medium of clause 14, wherein detecting the one or more local dimensional distortions comprises:
controlling irradiation of the alignment mark with radiation, the alignment mark comprising a geometric feature; and
detecting one or more phase and/or amplitude shifts in reflected radiation from the geometric feature, the one or more phase and/or amplitude shifts corresponding to one or more local dimensional distortions of the geometric feature.

16. The medium of clause 15, wherein the instructions further cause the computer to determine, based on the one or more detected phase and/or amplitude shifts, one or more of a parameter of the radiation, an alignment inspection location within the geometric feature, an alignment inspection location on a layer of a structure, or a radiation beam trajectory across the geometric feature.

17. The medium of any of clauses 15-16, wherein the geometric feature comprises a grating.

18. The medium of any of clauses 15-17, wherein detecting the one or more phase and/or amplitude shifts in the reflected radiation from the geometric feature comprises measuring a phase difference in reflected radiation of different diffraction orders.

19. The medium of any of clauses 15-18, wherein generating the alignment signal comprises:
determining, based on the one or more detected phase and/or amplitude shifts, one or more areas of the geometric feature that are relatively more symmetrical than other areas of the geometric feature; and
weighting one or more portions of a reflected radiation signal that correspond to radiation reflected from the one or more relatively more symmetrical areas heavier than other portions of the reflected radiation signal.

20. The medium of any of clauses 14-19, wherein the alignment mark is included in a layer of a substrate in a semiconductor device structure, the instructions further causing the computer to adjust a semiconductor device manufacturing parameter based on the alignment signal.

21. A system configured to generate an alignment signal, the system comprising:
one or more sensors configured to detect one or more local dimensional distortions of an alignment mark; and
one or more processors configured to generate the alignment signal based on the alignment mark, the alignment signal being weighted based on the one or more local dimensional distortions of the alignment mark.

22. The system of clause 21, further comprising a radiation source configured to irradiate the alignment mark with radiation, wherein detecting the one or more local dimensional distortions comprises:
irradiating, with the radiation source, the alignment mark with radiation, the alignment mark comprising a geometric feature; and
detecting, with the one or more sensors, one or more phase and/or amplitude shifts in reflected radiation from the geometric feature, the one or more phase and/or amplitude shifts corresponding to one or more local dimensional distortions of the geometric feature.

23. The system of clause 22, wherein the one or more processors are further configured to determine, based on the one or more detected phase and/or amplitude shifts, one or more of a parameter of the radiation, an alignment inspection location within the geometric feature, an alignment inspection location on a layer of a structure, or a radiation beam trajectory across the geometric feature.

24. The system of any of clauses 22-23, wherein the geometric feature comprises a grating.

25. The system of any of clauses 22-24, wherein detecting the one or more phase and/or amplitude shifts in the reflected radiation from the geometric feature comprises measuring a phase difference in reflected radiation of different diffraction orders.

26. The system of any of clauses 22-25, wherein generating the alignment signal comprises:
determining, based on the one or more detected phase and/or amplitude shifts, one or more areas of the geometric feature that are relatively more symmetrical than other areas of the geometric feature; and
weighting one or more portions of a reflected radiation signal that correspond to radiation reflected from the one or more relatively more symmetrical areas heavier than other portions of the reflected radiation signal.

27. The system of any of clauses 21-26, wherein the alignment mark is included in a layer of a substrate in a semiconductor device structure.

28. The system of clause 27, wherein the one or more processors are further configured to adjust a semiconductor device manufacturing parameter based on the alignment signal.

The concepts disclosed herein may simulate or mathematically model any generic imaging system for imaging sub wavelength features, and may be especially useful with emerging imaging technologies capable of producing increasingly shorter wavelengths. Emerging technologies already in use include EUV (extreme ultra violet), DUV lithography that is capable of producing a 193 nm wavelength with the use of an ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range.

While the concepts disclosed herein may be used for imaging on a substrate such as a silicon wafer, it shall be understood that the disclosed concepts may be used with any type of lithographic imaging systems, e.g., those used for imaging on substrates other than silicon wafers. In addition, the combination and sub-combinations of disclosed elements may comprise separate embodiments.

The descriptions above are intended to be illustrative, not limiting. Thus, it will be apparent to one skilled in the art that modifications may be made as described without departing from the scope of the claims set out below.

The invention claimed is:

1. A method for adjusting a semiconductor device manufacturing parameter, the method comprising:
   detecting one or more local dimensional distortions of an alignment mark using a first measurement to detect local dimensional distortions; and
   generating, based on the alignment mark, an alignment signal using a second different measurement to determine alignment, at least part of the alignment signal representing a part of the alignment mark being weighted based on the one or more local dimensional distortions of the alignment mark differently than at least part of the alignment signal representing a different part of the alignment mark, the alignment signal configured to be used to adjust the semiconductor device manufacturing parameter.

2. The method of claim 1, further comprising adjusting the semiconductor device manufacturing parameter based on the alignment signal.

3. The method of claim 1, wherein the semiconductor device manufacturing parameter is a stage position.

4. The method of claim 1, wherein the detecting the one or more local dimensional distortions comprises:
   irradiating the alignment mark with radiation, the alignment mark comprising a geometric feature; and
   detecting one or more phase and/or amplitude shifts in reflected radiation from the geometric feature, the one or more phase and/or amplitude shifts corresponding to one or more local dimensional distortions of the geometric feature.

5. The method of claim 4, further comprising determining, based on the one or more detected phase and/or amplitude shifts, one or more selected from: a parameter of the radiation, an alignment inspection location within the geometric feature, an alignment inspection location on a layer of a semiconductor device structure, or a radiation beam trajectory across the geometric feature.

6. A method for generating an alignment signal, the method comprising:
   detecting one or more local dimensional distortions of an alignment mark using a first measurement to detect local dimensional distortions; and
   generating, based on the alignment mark, the alignment signal using a second different measurement to determine alignment, at least part of the alignment signal representing a part of the alignment mark being weighted based on the one or more local dimensional distortions of the alignment mark differently than at least part of the alignment signal representing a different part of the alignment mark.

7. The method of claim 6, wherein the detecting the one or more local dimensional distortions comprises:
   irradiating the alignment mark with radiation, the alignment mark comprising a geometric feature; and
   detecting one or more phase and/or amplitude shifts in reflected radiation from the geometric feature, the one or more phase and/or amplitude shifts corresponding to one or more local dimensional distortions of the geometric feature.

8. The method of claim 7, further comprising determining, based on the one or more detected phase and/or amplitude shifts, one or more selected from: a parameter of the radiation, an alignment inspection location within the geometric feature, an alignment inspection location on a layer of a structure, or a radiation beam trajectory across the geometric feature.

9. The method of claim 7, wherein the geometric feature comprises a grating.

10. The method of claim 7, wherein the detecting the one or more phase and or amplitude shifts in the reflected radiation from the geometric feature comprises measuring a phase difference in reflected radiation of different diffraction orders.

11. The method of claim 7, wherein generating the alignment signal comprises:
    determining, based on the one or more detected phase and/or amplitude shifts, one or more areas of the geometric feature that are relatively more symmetrical than other areas of the geometric feature; and
    weighting one or more portions of a reflected radiation signal that correspond to radiation reflected from the one or more relatively more symmetrical areas heavier than other portions of the reflected radiation signal.

12. The method of claim 6, wherein the alignment mark is included in a layer of a substrate in a semiconductor device structure.

13. The method of claim 12, further comprising adjusting a semiconductor device manufacturing parameter based on the alignment signal.

14. A non-transitory computer-readable medium having instructions therein, the instructions, when executed by a computer system, configured to cause the computer system to at least:
    obtain detected one or more local dimensional distortions of an alignment mark based on a first measurement to detect local dimensional distortions; and
    generate, based on the alignment mark, an alignment signal from a second different measurement to determine alignment, at least part of the alignment signal representing a part of the alignment mark being weighted based on the one or more local dimensional distortions of the alignment mark differently than at least part of the alignment signal representing a different part of the alignment mark.

15. The medium of claim 14, wherein the instructions configured to cause the computer system to obtain detected one or more local dimensional distortions are further configured to cause the computer system to:
    control irradiation of the alignment mark with radiation, the alignment mark comprising a geometric feature; and
    obtain detected one or more phase and/or amplitude shifts in reflected radiation from the geometric feature, the one or more phase and/or amplitude shifts corresponding to one or more local dimensional distortions of the geometric feature.

16. The medium of claim 15, wherein the instructions are further configured to cause the computer system to determine, based on the one or more detected phase and/or amplitude shifts, one or more selected from: a parameter of the radiation, an alignment inspection location within the geometric feature, an alignment inspection location on a layer of a structure, or a radiation beam trajectory across the geometric feature.

17. The medium of claim 15, wherein the geometric feature comprises a grating.

18. The medium of claim 15, wherein the detected one or more phase and/or amplitude shifts in the reflected radiation from the geometric feature comprises a measured phase difference in reflected radiation of different diffraction orders.

19. The medium of claim 15, wherein the instructions configured to cause the computer system to generate the alignment signal are further configured to cause the computer system to:
   determine, based on the one or more detected phase and/or amplitude shifts, one or more areas of the geometric feature that are relatively more symmetrical than other areas of the geometric feature; and
   weight one or more portions of a reflected radiation signal that correspond to radiation reflected from the one or more relatively more symmetrical areas heavier than other portions of the reflected radiation signal.

20. The medium of claim 14, wherein the alignment mark is included in a layer of a substrate in a semiconductor device structure, and the instructions are further configured to cause the computer system to adjust a semiconductor device manufacturing parameter based on the alignment signal.

* * * * *